United States Patent
Booth et al.

(10) Patent No.: US 8,013,771 B2
(45) Date of Patent: Sep. 6, 2011

(54) METHOD AND APPARATUS FOR BANDPASS DIGITAL-TO-ANALOG CONVERSION

(75) Inventors: Richard W. D. Booth, San Jose, CA (US); Gregoire Le Grand de Mercey, San Jose, CA (US)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/688,734

(22) Filed: Jan. 15, 2010

(65) Prior Publication Data

US 2011/0175764 A1   Jul. 21, 2011

(51) Int. Cl.
   *H03M 1/66*   (2006.01)
(52) U.S. Cl. .......................... 341/144; 341/153
(58) Field of Classification Search .......... 332/108, 332/113, 116; 375/269; 341/144, 153, 154
   See application file for complete search history.

(56) References Cited

U.S. PATENT DOCUMENTS

| | | | |
|---|---|---|---|
| 4,433,310 A * | 2/1984 | Bic et al. ..................... | 332/151 |
| 4,529,950 A * | 7/1985 | Chazenfus et al. .......... | 332/108 |
| 6,411,237 B1 | 6/2002 | Lautzenhiser | |
| 6,775,304 B1 | 8/2004 | Ngo | |
| 6,992,609 B1 | 1/2006 | Zelenin et al. | |
| 7,003,048 B1 * | 2/2006 | Eibel et al. ................... | 375/295 |
| 2003/0201923 A1 | 10/2003 | Uno | |
| 2008/0075194 A1 | 3/2008 | Ravi et al. | |
| 2009/0195425 A1 | 8/2009 | Eloranta et al. | |

OTHER PUBLICATIONS

Schreier, R. et al., "Delta-Sigma Data Converters—Chapter 5—Bandpass and Quadrature Delta-Sigma Modulation", (www.sciencep.com, Wiley Publishers), pp. 139-177.
PCT Application No. PCT/US2011/021113 International Search Report, dated Mar. 15, 2011, 2 pages.
Razavi, Behzad; "Principles of Data Conversion System Design", Wiley-IEEE Press, Nov. 28, 1994; Chapter 4, pp. 62-71.

* cited by examiner

*Primary Examiner* — Brian Young

(57) ABSTRACT

The disclosed embodiments provide method and apparatus for digital to analog conversion of a signal that may be limited to a bandpass frequency. In an exemplary embodiment, a bandpass DAC is disclosed which includes a plurality of gates. Each gate receives a carrier signal and one of a plurality of input bits of a digital data. A combiner network is provided which includes a plurality of lossless elements corresponding to each of the plurality of gates. The combiner network receives the gate outputs and provides a digitally weighted signal. A resonating element connected to the combiner network resonates the combiner network and provides a filtered output signal which is linearly combined.

43 Claims, 27 Drawing Sheets

METHOD AND APPARATUS FOR BANDPASS DIGITAL-TO-ANALOG CONVERSION

FIELD OF THE INVENTION

The disclosure generally relates to a method and apparatus for digital-to-analog conversion of a bandpass signal. Specifically, the disclosed embodiments use lossless elements such as capacitors, inductors or transmission lines to achieve arbitrary or binary weighting of a plurality of output gates to thereby construct a resonant or bandpass DAC.

DESCRIPTION OF RELATED ART

FIG. 1 is a prior art binary weighted radio-frequency ("RF") combiner 100 using single ended (i.e., output is asymmetric between on and off states) amplifiers. The combiner 100 sums the outputs of four amplifiers with a binary weighting. The performance of the combiner 100 is limited by several effects and has several drawbacks. For example, the output impedance of the single ended amplifiers is not fixed for all phase angles of the RF waveform, the impedance is very low when the transistor is in the "on" state, and the impedance is inductive and possibly quite large when the transistor is in the "off" state. This distorts the weighting of the combined voltages at the output. Another limiting effect of this combiner 100 is the ratios of the transmission lines used in the combiner 100. In practice, even ratios as large as 8 to 1, as used in this example, are difficult to achieve.

Another drawback of single ended amplifiers is their inability to maintain a constant impedance for all phases of the RF waveform. For example, single ended amplifiers, like the one shown in FIG. 2, do not maintain a constant impedance during all phases of the RF waveform. The impedance changes when the single ended amplifier is turned off as compared to when the single ended amplifier is turned on. As an example, the single ended amplifier 200 includes a direct current ("DC") power supply 205, an inductor 210, a transistor 215, a single ended amplifier 220, and a ground 225.

When the single ended amplifier 220 is providing current to the transistor 215, the transistor 215 is in the "on" state and acts as a short circuit to ground. The output signal is shorted to ground and the output impedance is very low.

When the single ended amplifier 220 is not providing current to the transistor 215, the transistor 215 is in the "off" state and acts as an open circuit. The output signal is connected to the inductor 210 and the output impedance is the impedance of the inductor 210 or $j\omega L$.

Designing constant impedance amplifiers for RF signals is a difficult task. The combination of the constant impedance amplifier circuits and the various combining circuits illustrated in this disclosure circumvent these drawbacks.

There are applications where a more general weighting of waveforms is useful, for example, for weighting different phased signals such as for digital transmitters. A digital-to-analog converter ("DAC") is a specific application of this concept. A DAC converts an abstract finite-precision number, such as a fixed point binary number, into a concrete physical quantity such as a voltage value. DACs are often used to convert finite-precision time series data to a continually-varying analog signal.

Typical conventional DACs include resistive elements arranged and sized to provide binary weighting. In a conventional DAC, data bits (e.g., BIT 0, BIT 1, BIT 2 and BIT 3) are directed to different resistors. The resistors typically have increasing resistance values, which correlate with a decrease in bit significance. The resistors' outputs are then summed and a voltage signal is output. Because such circuits contain resistors, they are inherently lossy. Moreover, conventional DACs are optimized for baseband signals and not for bandpass signals. Conventional DACs are susceptible to parasitic capacitance loading effects which limit the circuit's bandwidth. Therefore, there is a need for a method and apparatus for efficient bandpass digital-to-analog conversion.

SUMMARY

The disclosed embodiments use non-dissipative (interchangeably, lossless) elements such as capacitors, inductors or transmission lines to achieve binary or arbitrary weighting of a plurality of gate outputs to thereby construct a resonant or bandpass DAC.

In one embodiment, the disclosure relates to a converter. The converter includes a plurality of constant impedance sources, each constant impedance source having a constant output impedance and receiving a different carrier signal of arbitrary amplitude and phase and one of a plurality of input bits of a digital data, each constant impedance source providing an output, a combiner network having a plurality of impedance elements corresponding to the plurality of constant impedance sources, the combiner network receiving the plurality of outputs and providing a signal, a resonating element connected to the combiner network for resonating the signal received from the combiner network and providing a filtered output signal, a load impedance element connected to the resonating element and an output node connected between the load impedance element and the resonating element, the output node outputting the filtered output signal.

In one embodiment, the disclosure relates to a converter comprising a plurality of first constant impedance sources and a second constant impedance source, each constant impedance source having a constant output impedance, each constant impedance source providing an output, a combiner network having a plurality of first impedance elements corresponding to the plurality of first constant impedance sources and a plurality of second impedance elements coupled to the second constant impedance source, the combiner network receiving the plurality of outputs and providing a signal, a resonating element connected to the combiner network for resonating the signal received from the combiner network and providing a filtered output signal, a load impedance element connected to the resonating element, and an output node connected between the load impedance element and the resonating element, the output node outputting the filtered output signal.

In one embodiment, the disclosure relates to a digital-to-analog converter which comprises: a plurality of gates, each gate receiving a carrier signal and one of a plurality of input bits of digital data, each gate providing a gate output; a combiner network having a plurality of lossless elements corresponding to each of the plurality of gates, the combiner network receiving the plurality of gate outputs and providing a digitally weighted signal; a resonating element connected to the combiner network for resonating the combiner network and providing a filtered output signal; a load resistor connected to the resonating element; and an output node connected to the load resistor and the resonating element, the output node outputting the filtered output signal. The digital-to-analog converter operates as a band-pass circuit and each of the plurality of the lossless elements can have a different weighting.

In another embodiment, the disclosure relates to a method for digital-to-analog conversion of a bandpass signal by: (i) receiving a carrier signal and one of a plurality of input bits of digital data at a plurality of gates to provide a plurality of gate outputs; (ii) receiving each of the plurality of output gates at a corresponding one of a plurality of lossless elements to provide a weighted gate output from each lossless element; (iii) combining the plurality of weighted gate outputs to form a combined signal; and (iv) filtering the combined signal through a resonator to provide a digitally weighted filtered output signal. Each of the plurality of the lossless elements can have a different binary weighting.

In still another embodiment, the disclosure relates to a digital-to-analog converter which comprises: a plurality of gates, each gate receiving a carrier signal and one of a plurality of input bits of digital data, each gate providing a gate output; a combiner network having a plurality of first lossless elements and a plurality of second lossless elements, the plurality of first lossless elements corresponding to each of the plurality of gates, the combiner network receiving the plurality of gate outputs and providing a weighted output; a resonating element connected to the combiner network for resonating the combiner network and providing a filtered weighted output; a load resistor connected to the resonating element; and an output node connected to the load resistor for outputting the filtered weighted output. The digital-to-analog converter can operate at bandpass frequencies to provide a digitally weighted output signal. In one embodiment, the first lossless elements are digitally weighted to about half of the second lossless elements.

In yet another embodiment, the disclosure relates to a method for digital-to-analog conversion of a bandpass signal by: receiving a carrier signal and one of a plurality of input bits of digital data at a plurality of gates to provide a plurality of gate outputs; receiving each of the plurality of gate outputs at a plurality of first lossless elements to provide a plurality of first output signals, each of the plurality of first lossless elements corresponding to the each of the plurality of gates; combining the plurality of first outputs signals at a plurality of second lossless elements to provide a weighted output signal; and filtering the weighted output signal through a lossless resonator to provide a weighted and filtered output signal; wherein each of the first lossless elements is digitally weighted to about half of one of the second lossless elements.

In still another embodiment, the disclosure relates to a digital-to-analog converter, comprising: a plurality of gates, each gate receiving a carrier signal and one of a plurality of input bits of digital data, each gate providing a gate output; a combiner network having a plurality of first lossless elements and a plurality of second lossless elements, each of the first lossless elements having a different weighting than the other first lossless elements, the combiner network receiving the gate outputs and providing a weighted output; a lossless resonating element connected to the combiner network for resonating the combiner network and providing a filtered weighted output; a load resistor connected to the lossless resonating element; and an output node connected to the load resistor for outputting the filtered weighted output. The plurality of second lossless elements are sized such that at least one lossless element has twice the weighting of another lossless element.

In another embodiment, the disclosure relates to a method for digital-to-analog conversion of a bandpass signal by receiving a carrier signal and one of a plurality of input bits of digital data at a plurality of gates to provide a plurality of gate outputs; receiving the plurality of the gate outputs at a combiner network and providing a weighted output signal, the combiner network having at least one first lossless element and a plurality of second lossless elements; and filtering the weighted output signal at a lossless resonator to provide a filtered weighted output signal; wherein the plurality of second lossless elements are sized such that at least one of the second lossless elements has twice the weighting of another second lossless element.

BRIEF DESCRIPTION OF THE DRAWINGS

These and other embodiments of the disclosure will be discussed with reference to the following exemplary and non-limiting illustrations, in which like elements are numbered similarly, and where.

DETAILED DESCRIPTION

Figure 1:
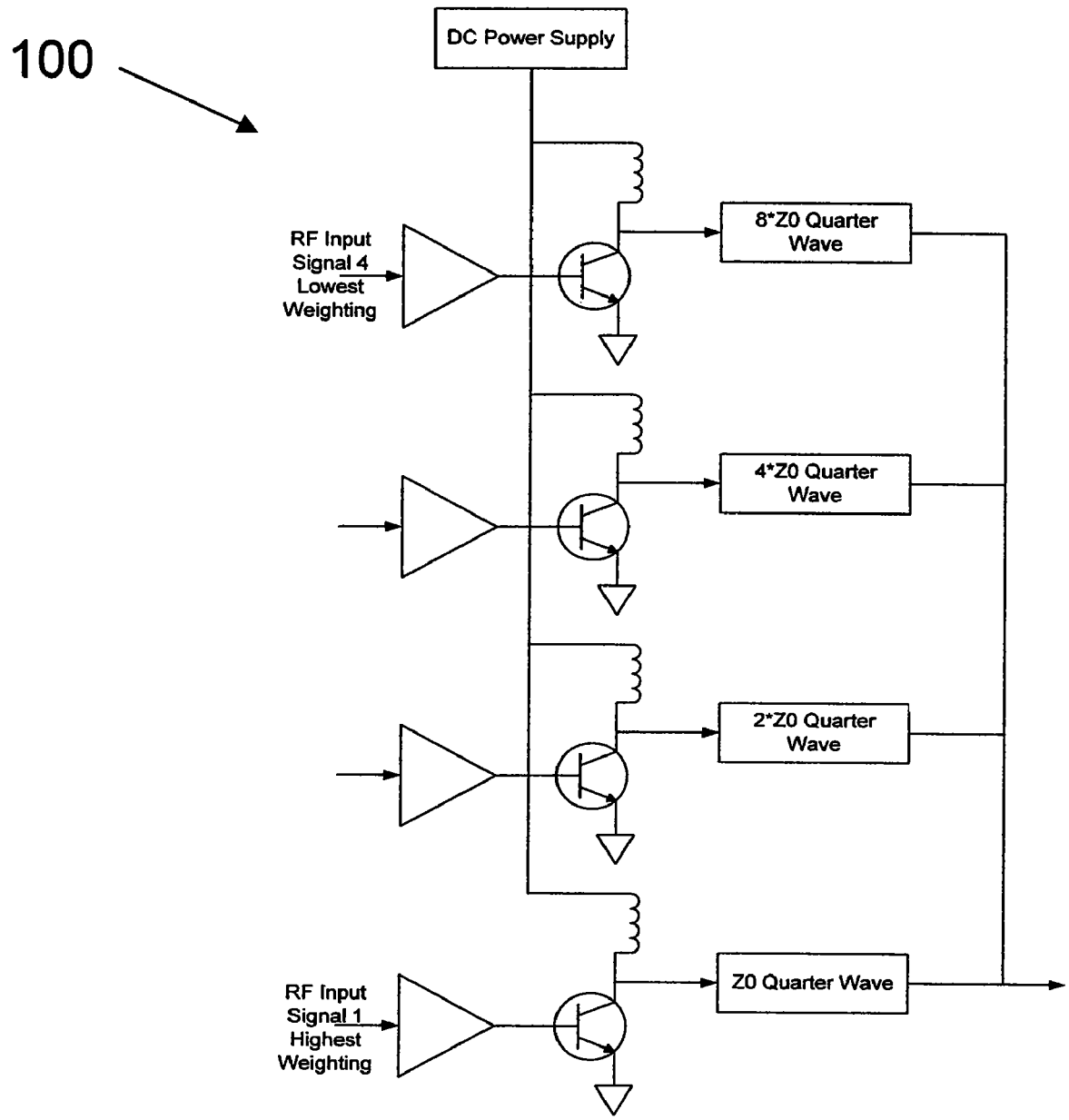
FIG. 1 is a prior art binary weighted RF combiner using single ended amplifiers.
Figure 2:
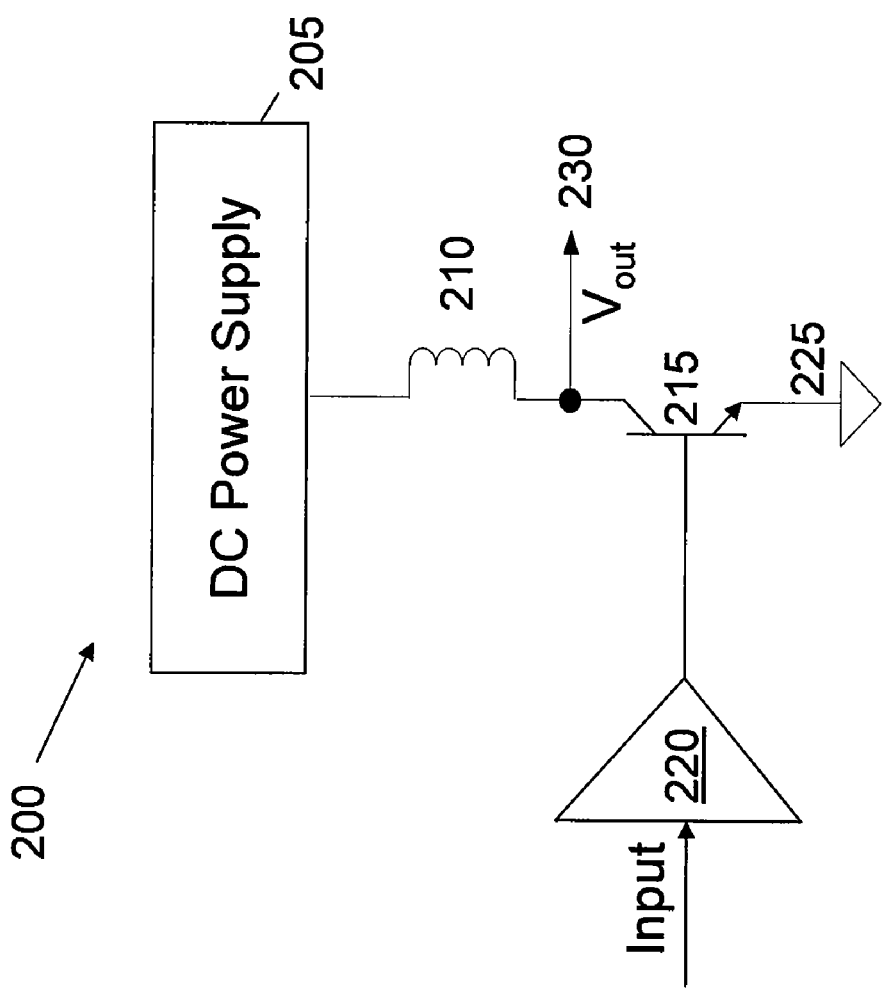
FIG. 2 is an example of one of the single ended amplifiers shown in FIG. 1.
Figure 3:
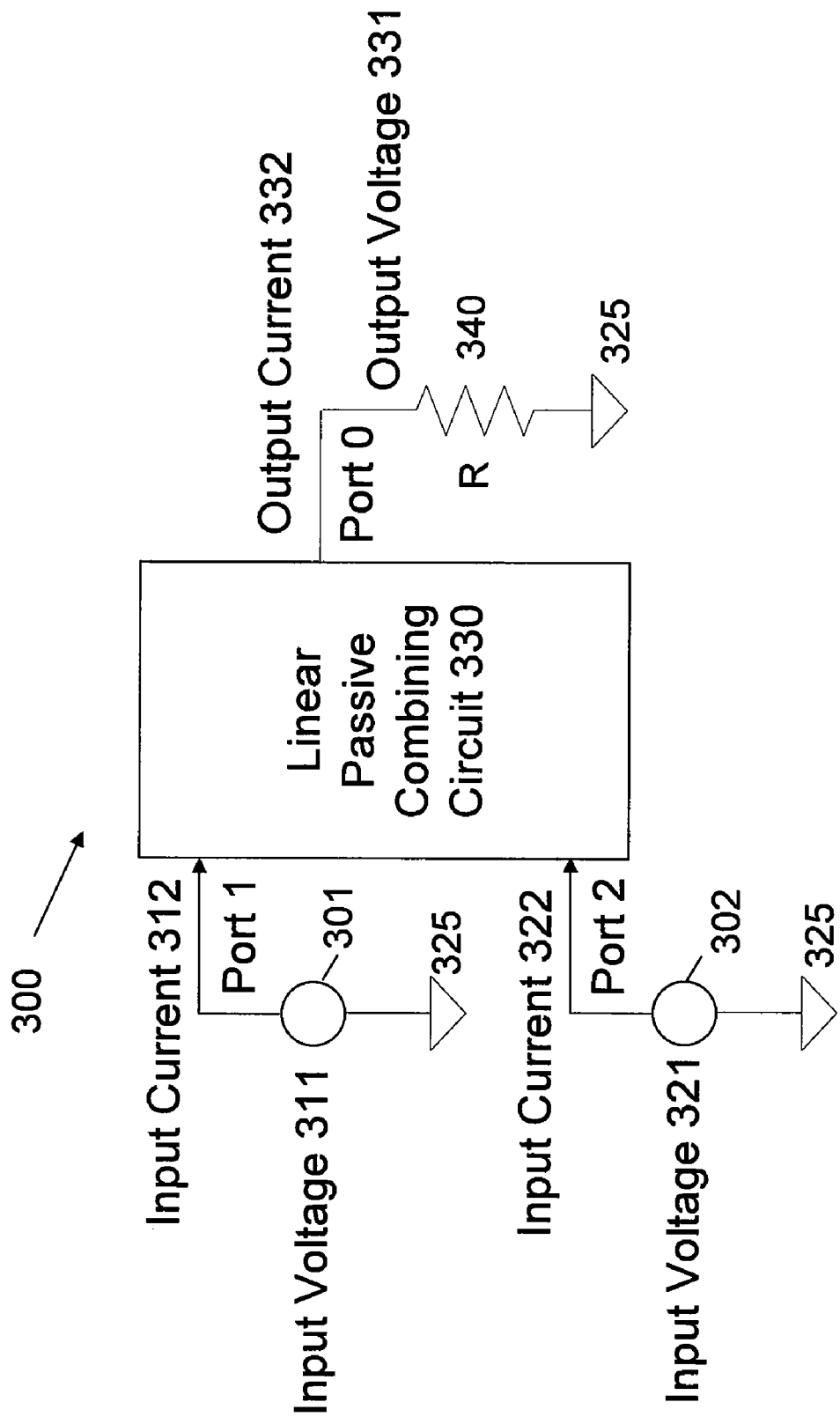
FIG. 3 is a simplified circuit diagram of a combiner network according to one embodiment of the invention.

FIG. 3 is a simplified circuit diagram of a combiner network 300 according to one embodiment of the invention. The combiner network 300 includes a first voltage (or current) source 301 capable of generating a first input voltage 311 (or a first input current 312), a second voltage (or current) source 302 capable of generating a second input voltage 321 (or a second input current 322), a linear passive combining circuit 330, and a load resistor 340. As an example, the driving amplifiers are shown as voltage sources 301 and 302. The voltage sources 301 and 302 may include a fixed output impedance, which is absorbed by the linear passive combining circuit 330. The fixed output impedance may lead to restrictions on the weighting of the voltage sources 301 and 302. The combining circuit 330 may include lossy and/or lossless circuit elements.

The mathematical equations below are illustrated for two voltage sources (e.g., voltage sources 301 and 302), however, the mathematical equations can be extended to any number of voltages sources or current sources.

The combiner circuit 330 is assumed to be linear and y parameters are used for this example. Assuming three ports (i.e., ports 0, 1 and 2), the following equations apply.

$$i_0 = y_{00}*v_0 + y_{01}*v_1 + y_{02}*v_2$$

$$i_1 = y_{10}*v_0 + y_{11}*v_1 + y_{12}*v_2$$

$$i_2 = y_{20}*v_0 + y_{21}*v_1 + y_{22}*v_2$$

Assume the load resistor 340 is connected to port 0, then $i_0 = -v_0/R$. Rearranging the equation, results in the following: $v_0 = -y_{01}*v_1/(y_{00}+1/R) - y_{02}*v_2/(y_{00}+1/R)$. If $y_{02} = y_{01}/2$, then $v_0 = -(y_{01}/(w_{00}+1/R))*(v_1+v_2)/2$, which achieves binary weighting.

Dynamic load pull is the effect one voltage source has on the other voltage source in terms of drive current. The effects of dynamic load pull can be quantified in terms of the following equations.

$$i_1 = (y_{11} - y_{10}*y_{01}/(y_{00}+1/R))*v_1 + (y_{12} - y_{10}*y_{02}/(y_{00}+1/R))*v_2.$$

$$i_2 = (y_{22} - y_{20}*y_{02}/(y_{00}+1/R))*v_2 + (y_{21} - y_{20}*y_{01}/(y_{00}+1/R))*v_1.$$

The second term in each of the above equations reflects the change in current supplied by each voltage source as the second voltage source is activated. The difference in current is accounted for when designing the amplifiers (e.g., voltage sources 301 and 302) that are driving the combining circuit 330.

The combining circuit 330 can be designed to achieve binary weighting, arbitrary weighting, equal weighting, or any other weighting, of the input voltage sources 301 and 302. In addition, the combining circuit 330 can combine arbitrary phased signals from the input voltage sources 301 and 302. Each voltage source is coupled to the output of the other source and changes the current to be supplied by the sources depending on the magnitude and phase of each source. The accuracy of the combiner network 330 depends on the voltages sources 301 and 302 maintaining a voltage source characteristic. A voltage source is characterized by maintaining a constant output impedance for all phase angles of the voltage waveform.

Figure 4:
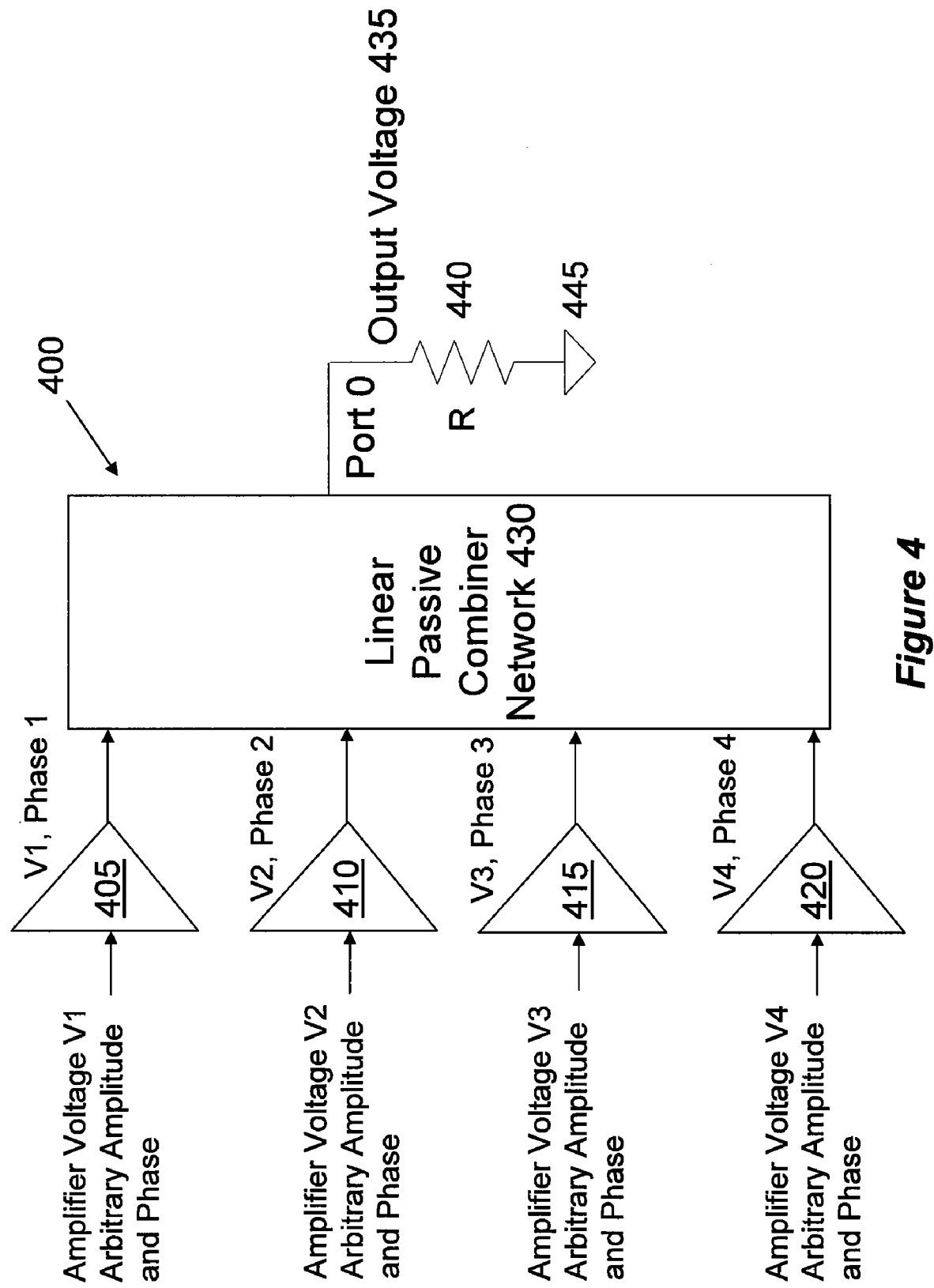
FIG. 4 is a digital power amplifier network having a plurality of amplifiers, a linear passive combiner network, and an output load resistor according to one embodiment of the invention.

FIG. 4 is a digital power amplifier network 400 having a plurality of amplifiers 405, 410, 415 and 420, a linear passive combiner network 430, and an output load resistor 440 according to one embodiment of the invention. The digital power amplifier network 400 is an amplifier that sums up the contributions from multiple amplifiers 405, 410, 415 and 420. The output signal or voltage 435 is the weighted sum ($V_1*\alpha_1 + V_2*\alpha_2 + V_3*\alpha_3 + V_4*\alpha_4$, where $\alpha_i$ are the weights) of all the amplifiers 405, 410, 415 and 420 driving the digital power amplifier network 400. Each amplifier 405, 410, 415 and 420 may output an arbitrary or random voltage (V1, V2, V3 and V4) and phase (Phase 1, Phase 2, Phase 3 and Phase 4). The amplifiers 405, 410, 415 and 420 may each have arbitrary frequencies and the weighting of each amplifier may change depending on the design of the linear passive combiner network 430. The combiner network 430 may have lossless or lossy circuit elements. The finite output impedance from each amplifier 405, 410, 415 and 420 may be combined into the combiner network 430. The combiner network 430 can include circuit elements such as capacitors, inductors, resistors, transformers, transmission lines, and combinations thereof.

Figure 5:
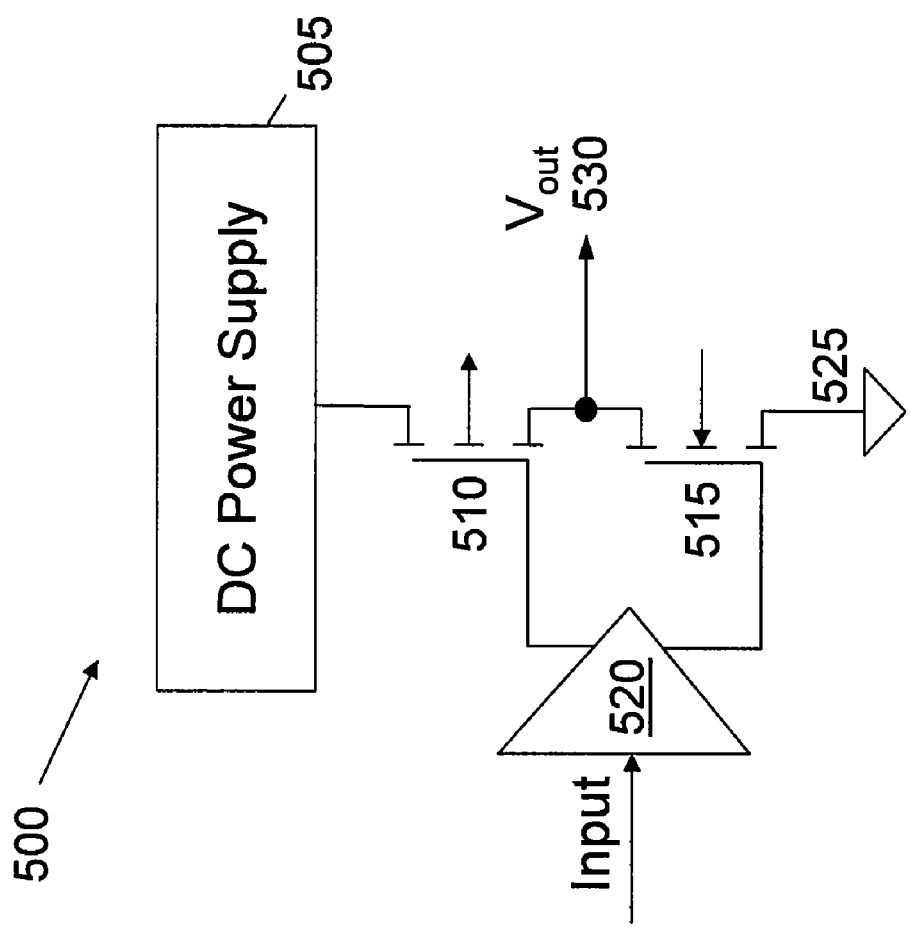
FIG. 5 is a complementary output stage amplifier according to one embodiment of the invention.

FIG. 5 is a complementary output stage amplifier 500 according to one embodiment of the invention. The output stage amplifier 500 includes a DC power supply 505, switches 510 and 515, a driver amplifier 520, a ground 525, and an output 530. The two switches 510 and 515 receive complementary inputs so that one switch is in the ON state while the other switch is in the OFF state. For example, when switch 510 is in the ON state, switch 515 is in the OFF state, and the output 530 is in a high state because it is coupled to the DC power supply 505. Conversely, when switch 510 is in the OFF state, switch 515 is in the ON state, and the output 530 is in a low state because it is coupled to the ground 525. The output 530 maintains a low output impedance in both the high and low states.

Figure 6:
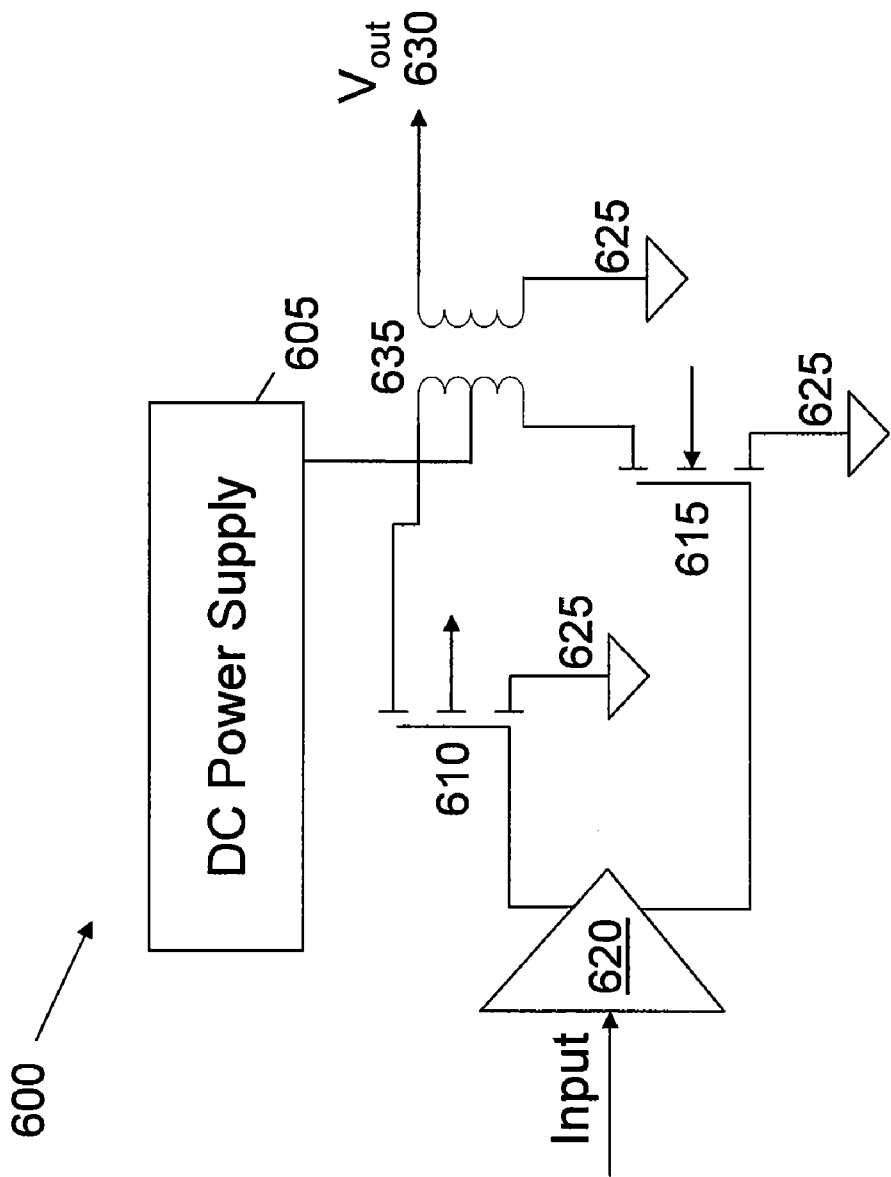
FIG. 6 is a transformer coupled class D amplifier according to one embodiment of the invention.

FIG. 6 is a transformer coupled class D amplifier 600 according to one embodiment of the invention. The amplifier 600 includes a DC power supply 605, switches 610 and 615, a driver amplifier 620, a ground 625, an output 630, and a transformer 635. The two switches 610 and 615 receive complementary inputs so that one switch is in the ON state while the other switch is in the OFF state. For example, when switch 610 is in the ON state, switch 615 is in the OFF state, and the output 630 is in a high state because it is coupled to the DC power supply 605. Conversely, when switch 610 is in the OFF state, switch 615 is in the ON state, and the output 630 is in a low state because it is coupled to the ground 625. The output 630 maintains a low output impedance in both the high and low states.

In both FIGS. 5 and 6, the outputs 530 and 630 are switching type waveforms and have impedances that are the same in both the high and low states.

Figure 7:
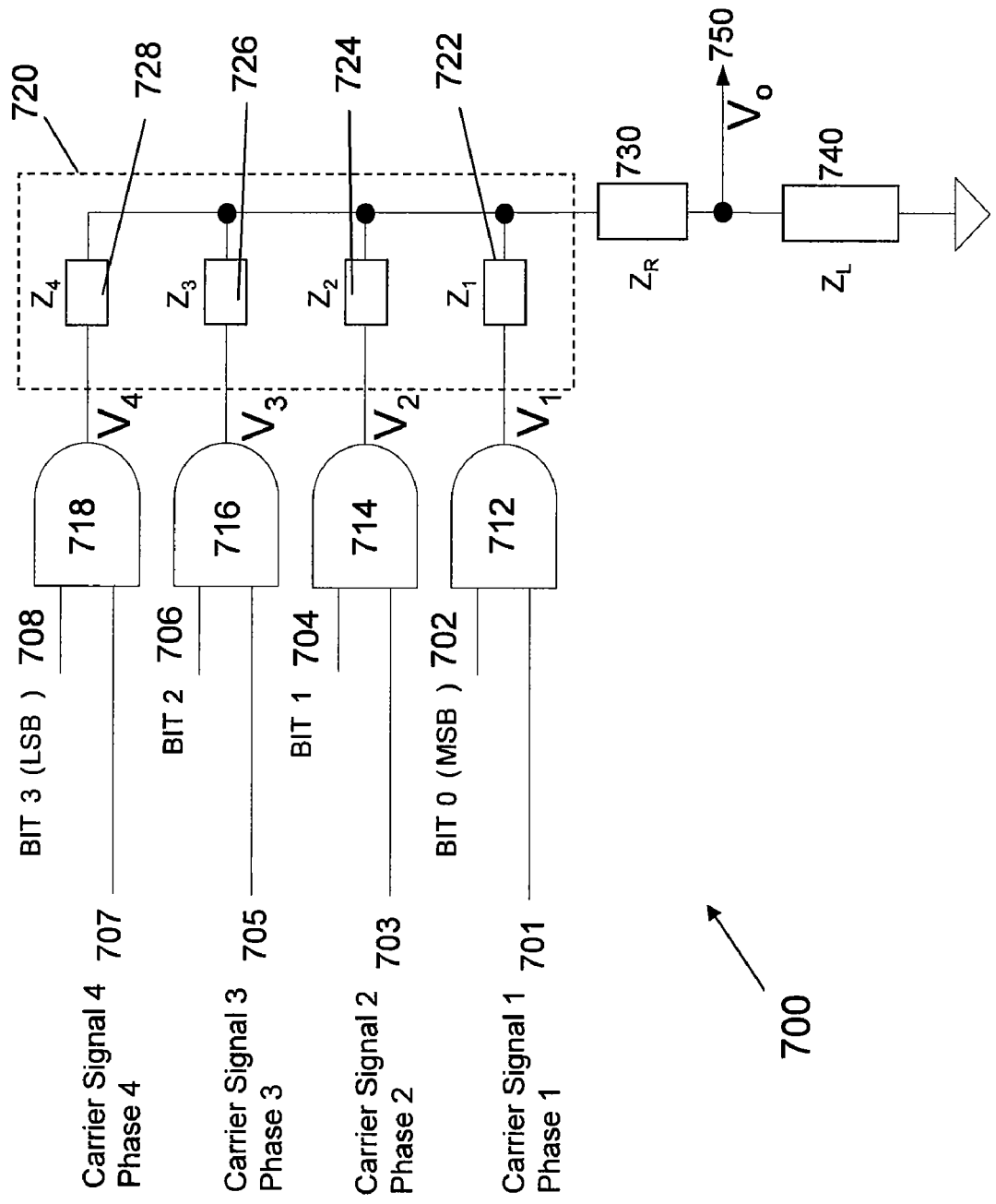
FIG. 7 is a general circuit diagram for an arbitrary weighted combiner with different input carrier signals of arbitrary amplitude, frequency and phase according to one embodiment of the invention.

FIG. 7 is a general circuit diagram 700 for an arbitrary weighted combiner 720 with different input carrier signals 701, 703, 705 and 707 of arbitrary amplitude, frequency and phase according to one embodiment of the invention. Throughout the specification, AND gates are shown, for example as 712, 714, 716 and 718, for illustrative purposes; however, the AND gates (throughout the specification) may be replaced with constant impedance sources, digital gates, constant impedance digital AND gates, complementary switch mode amplifiers, voltage mode class D (digital) amplifiers, and combinations thereof. As an example, each AND gate may be replaced with a digital AND gate directly connected to a class D switching amplifier such that the digital data bits and the carrier signal(s) are fed into the digital AND gates and the output of the class D switching amplifier is directly connected to the combiner.

In one embodiment, each AND gate has a complementary implementation, such as CMOS, and has a constant output impedance. In addition, each AND gate may allow for digital selection of the input signal to the combiner. In other words, each AND gate can turn on and off the input of the carrier signal. The constant impedance of the AND gates are independent of the phase of the carrier signal.

As an example, AND gates 712, 714, 716 and 718 receive digital data bits 702 (BIT 0), 704 (BIT 1), 706 (BIT 2) and 708 (BIT 3), respectively. The four bits are used to illustrate an example and should not be used to limit the invention. For example, less than or more than four bits may also be used. Also, each AND gates 712, 714, 716 and 718 receives a different or separate carrier signal 701, 703, 705 and 707 of arbitrary amplitude, frequency and phase. As an example, each carrier signal 701, 703, 705 and 707 has an arbitrary amplitude, frequency and phase that are different when compared to another carrier signal. That is, carrier signal 701 may have amplitude V0 and phase P0, carrier signal 703 may have amplitude V1 and phase P1, carrier signal 705 may have amplitude V2 and phase P2, and carrier signal 707 may have amplitude V3 and phase P3. The frequency of each carrier signal 701, 703, 705 and 707 may also be different from the frequency of another carrier signal. In addition, the output amplitudes $V_1$, $V_2$, $V_3$ and $V_4$ of each gate 712, 714, 716 and 718 may be arbitrarily set.

Data BIT 0 corresponds to the most significant bit ("MSB") while data bit BIT 3 corresponds to the least significant bit ("LSB"). Thus, each AND gate receives a different carrier input signal 701, 703, 705 or 707 and a data bit 702, 704, 706 or 708. The bits turn on the gate with a digital word that is proportional to the amplitude of the output signal. In one or more embodiments, each carrier signal input of each AND gate may have different amplitudes, frequencies and phases.

The combiner network 720 receives the AND gates' outputs. The combiner network 720 comprises four impedance elements 722, 724, 726 and 728 designated as $Z_1$, $Z_2$, $Z_3$ and $Z_4$. Each impedance element 722, 724, 726 and 728 is connected to the output of the corresponding AND gate 712, 714, 716 and 718. FIG. 7 has been generically represented as impedance elements or values as designed by the Zs. The impedance elements 722, 724, 726 and 728 can include capacitors, inductors, transmission lines, and combinations thereof.

The circuit diagram 700 may include a resonating element ($Z_R$) 730 (e.g., an inductor or a transformer) that resonates the combiner network 720 and the output node 750 provides the output signal. In the arbitrary weighted combiner example of FIG. 7, the output linearity is a function of the impedance elements and the output power is determined based on the arbitrary weighted ratios. The circuit diagram 700 may include a load impedance element 740.

The output voltage 750 can be represented as follows:
$Vo=(V_1*(Z/Z_1)+V_2*(Z/Z_2)+V_3*(Z/Z_3)+V_4*(Z/Z_4))*(Z_L/(Z_L+Z_R))$, where $1/Z=(1/(Z_L+Z_R)+(1/Z_1)+(1/Z_2)+(1/Z_3)+(1/Z_4))$. This equation assumes that the voltage source is ideal (i.e., the output impedance of the voltage sources is assumed to be about zero).

Figure 8:
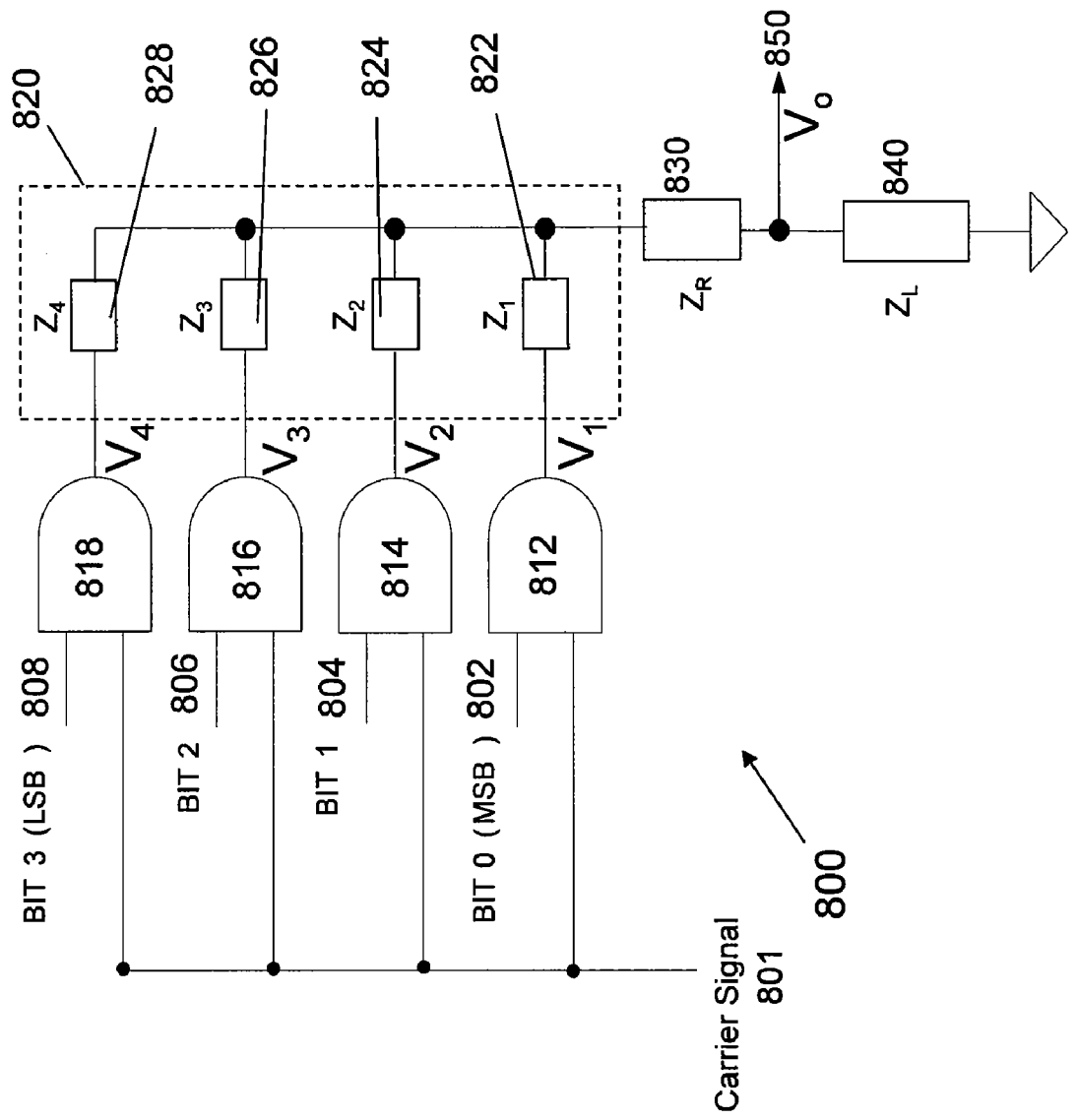
FIG. 8 is a general circuit diagram for an arbitrary weighted combiner with identical input carrier signals according to one embodiment of the invention.

FIG. 8 is a general circuit diagram 800 for an arbitrary weighted combiner 820 with identical input carrier signals 801 according to one embodiment of the invention. FIG. 8 is similar to FIG. 7 except the carrier signal 801 input into all the AND gates 812, 814, 816 and 818 is the same for all the gates. In this example embodiment, the carrier signal 801 is the same at each gate input. Therefore, all the AND gates 812, 814, 816 and 818 have an input carrier signal that has the same arbitrary amplitude, frequency and phase.

Figure 9:
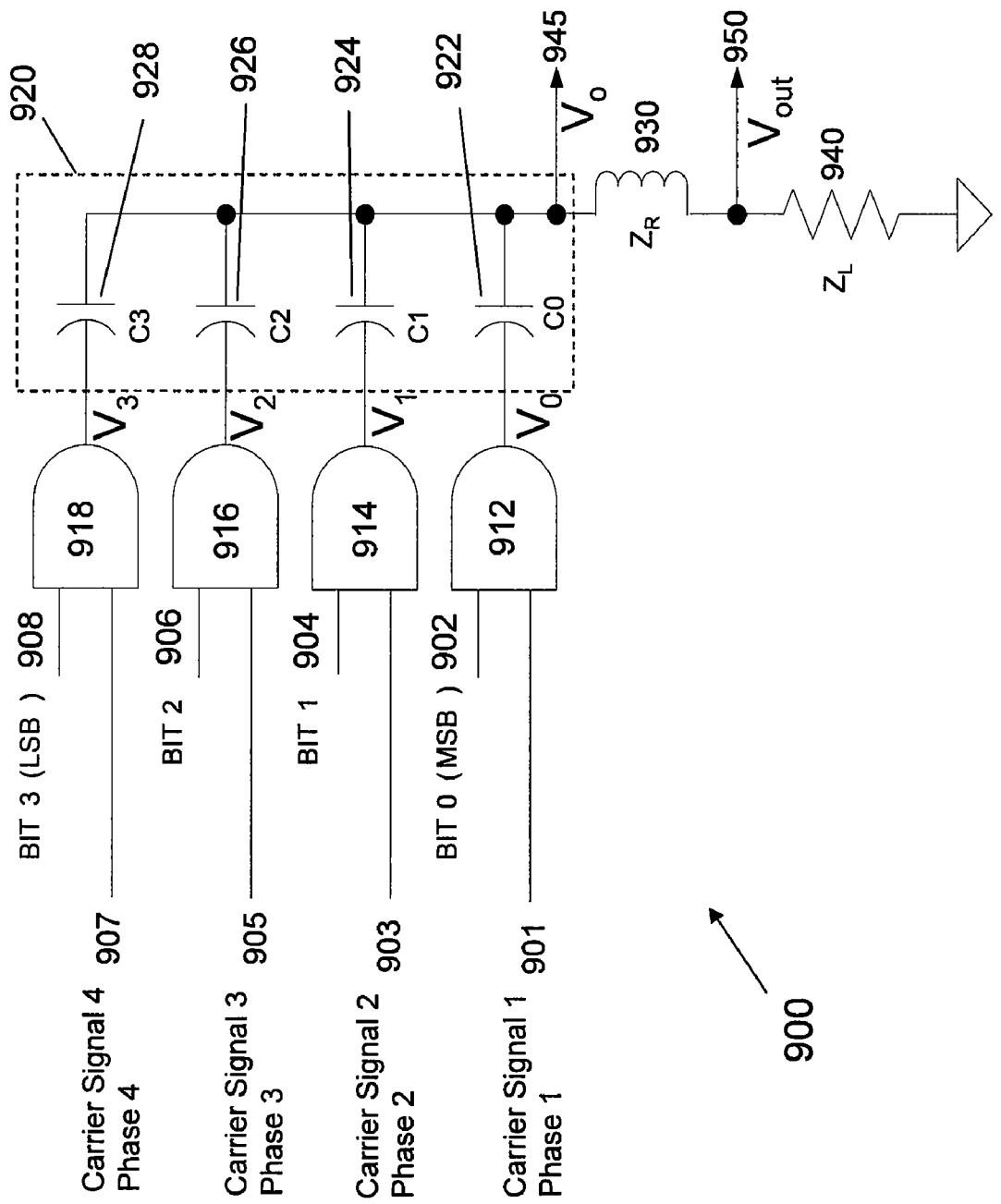
FIG. 9 is a circuit diagram for an arbitrary weighted combiner with different input carrier signals of arbitrary amplitude, frequency and phase using capacitive weighting and resonated with an inductor according to one embodiment of the invention.

FIG. 9 is a circuit diagram 900 for an arbitrary weighted combiner 920 with different input carrier signals 901, 903, 905 and 907 of arbitrary amplitude, frequency and phase using capacitive weighting and resonated with an inductor according to one embodiment of the invention. As an example, AND gates 912, 914, 916 and 918 receive digital data bits 902 (BIT 0), 904 (BIT 1), 906 (BIT 2) and 908 (BIT 3), respectively. The four bits are used to illustrate an example and should not be used to limit the invention. For example, less than or more than four bits may also be used. Also, each AND gates 912, 914, 916 and 918 receives a different or separate carrier signal 901, 903, 905 and 907 of arbitrary amplitude, frequency and phase. As an example, each carrier signal 901, 903, 905 and 907 has an arbitrary amplitude, frequency and phase that are different when compared to another carrier signal. That is, carrier signal 901 may have amplitude V0 and phase P0, carrier signal 903 may have amplitude V1 and phase P1, carrier signal 905 may have amplitude V2 and phase P2, and carrier signal 907 may have amplitude V3 and phase P3. The frequency of each carrier signal 901, 903, 905 and 907 may also be different from the frequency of another carrier signal. In addition, the output amplitudes $V_1$, $V_2$, $V_3$ and $V_4$ of each gate 912, 914, 916 and 918 may be arbitrarily set.

Data BIT 0 corresponds to the most significant bit ("MSB") while data bit BIT 3 corresponds to the least significant bit ("LSB"). Thus, each AND gate receives a different carrier input signal 901, 903, 905 or 907 and a data bit 902, 904, 906 or 908. The bits turn on the gate with a digital word that is proportional to the amplitude of the output signal. In one or more embodiments, each carrier signal input of each AND gate may have different amplitudes, frequencies and phases.

The combiner network 920 receives the AND gates' outputs. The combiner network 920 comprises four lossless elements 922, 924, 926 and 928. The lossless elements can include capacitors, inductors, transmission lines, and combinations thereof. In the exemplary embodiment of FIG. 9, the combiner network 920 comprises capacitors 922, 924, 926 and 928. The capacitors 922, 924, 926 and 928 correspond respectively with the AND gates 912, 914, 916 and 918. The capacitors 922, 924, 926 and 928 have arbitrary capacitance values. For example, capacitor 922 has capacitance C0, capacitor 924 has capacitance C1, capacitor 926 has capacitance C2 and capacitor 928 has capacitance C3.

The resonating element 930 is an inductor and resonates the combiner network 920 and the output node 950 provides the output signal. The circuit diagram 900 may include a load resistor 940. In the arbitrary weighted capacitive DAC example of FIG. 9, the output linearity is a function of the capacitors and the output power is determined based on the arbitrary weighted ratios. The use of lossless elements leads to high conversion efficiency. Further tuning of the resonance can also increase the circuit efficiency. Finally, the circuit can achieve high bandwidths.

Figure 10:
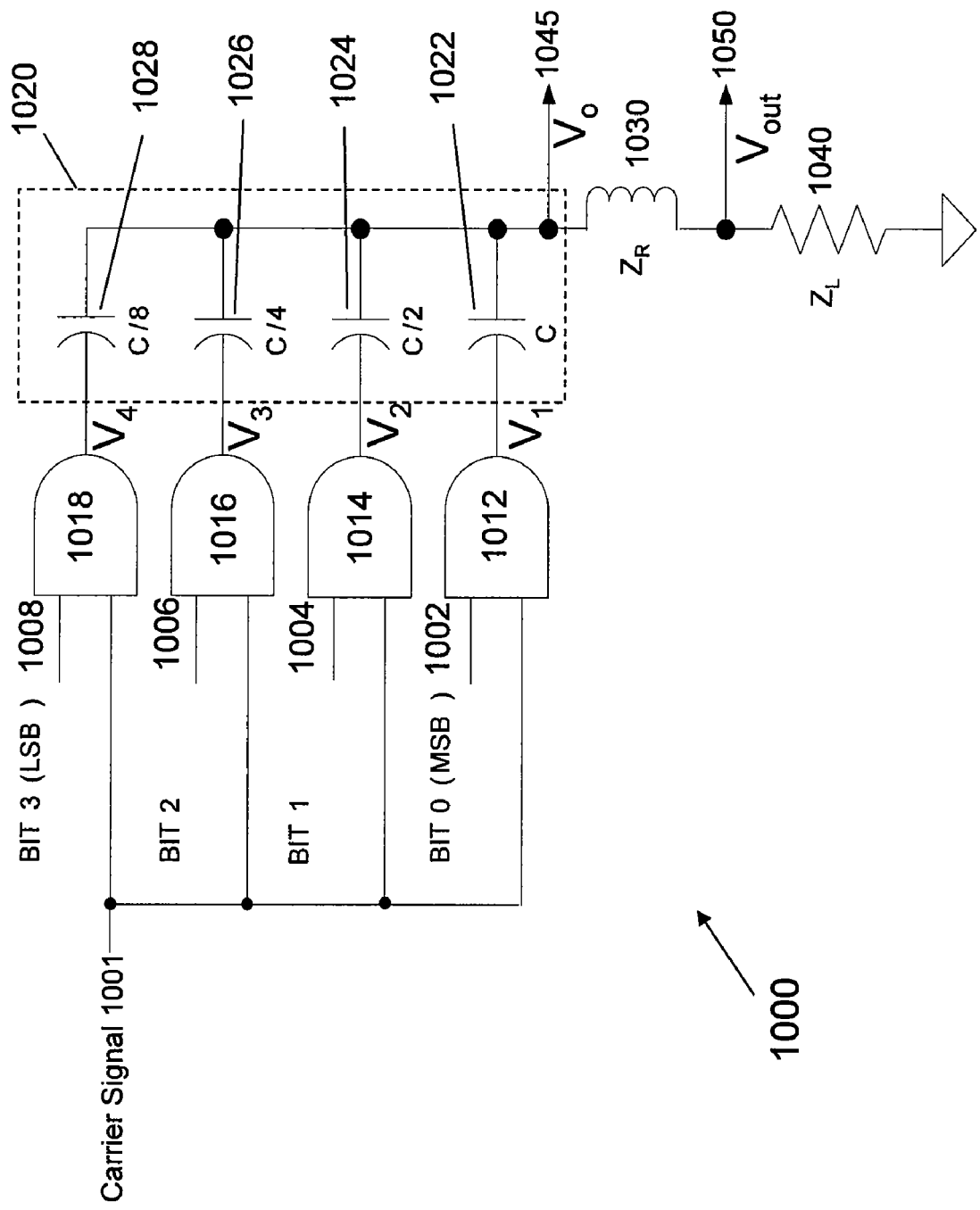
FIG. 10 is a circuit diagram for a binary weighted combiner with identical input carrier signals using capacitive weighting and resonated with an inductor according to one embodiment of the invention.

FIG. 10 is a circuit diagram 1000 for a binary weighted combiner 1020 with identical input carrier signals using capacitive weighting and resonated with an inductor according to one embodiment of the invention. The AND gates 1012, 1014, 1016 and 1018 receive digital data bits 1002 (BIT 0), 1004 (BIT 1), 1006 (BIT 2) and 1008 (BIT 3), respectively. The four bits are used to illustrate an example and should not be used to limit the invention. For example, less than or more than four bits may also be used. The AND gates also receive the same carrier signal 1001. In another embodiment, a different carrier signal (e.g., 1001, 1003, 1005 and 1007) for each AND gate may be used.

Data BIT 0 corresponds to the most significant bit ("MSB") while data bit BIT 3 corresponds to the least significant bit ("LSB"). Thus, each AND gate receives a carrier input signal 1001 and a data bit. The bits turn on the gate with a digital word That is proportional to the amplitude of the output signal. In one or more embodiments, the carrier signal 1001 input for each AND gate is the same signal.

The combiner network 1020 receives the AND gates' outputs. The combiner network 1020 comprises four lossless elements. The lossless elements can include capacitors, inductors, transmission lines, and combinations thereof.

In the exemplary embodiment of FIG. 10, the combiner network 1020 comprises binary weighted capacitors 1022, 1024, 1026 and 1028. The capacitors 1022, 1024, 1026 and 1028 correspond respectively with the AND gates 1012, 1014, 1016 and 1018. The capacitors 1012, 1014, 1016 and 1018 have capacitance values which decrease from the AND gate receiving the MSB to the AND gate receiving the LSB. Thus, capacitor 1022 has capacitance C, capacitor 1024 has capacitance C/2, capacitor 1026 has capacitance C/4 and capacitor 1028 has capacitance C/8. This binary weighted relationship can be summarized as follows:

$$C_i = C/2^{(i-1)} \text{ for } i=1 \text{ to } n \text{ where } n \text{ is the number of bits.} \quad (1)$$

In Equation 1, i is a capacitor number which increases from unity for the capacitor corresponding to a gate receiving the MSB (capacitor 1022) to n for the capacitor corresponding to a gate receiving the LSB (capacitor 1028). The resonating element 1030 resonates the combiner network 1020 and the output node 1050 provides the output signal.

The combiner network 1020 provides binary weighting of capacitors 1022, 1024, 1026 and 1028. This results in a binary weighting of the carrier signal at the load resistor 1040. The weighting is linear. In the embodiment of FIG. 10, the power supplied by each bit is progressively lower as the bit significance decreases.

In the binary weighted capacitive DAC of FIG. 10, the output linearity is a function of the capacitors. Moreover, the use of lossless elements leads to high conversion efficiency. Further tuning of the resonance can also increase the circuit efficiency. Finally, the circuit can achieve high bandwidths.

The binary weighted values for the capacitors are one example of the invention. If an arbitrary weighted ratio is used for each capacitor, the output power is determined based on the arbitrary weighted ratios.

The impedances at the voltage source outputs are capacitors and the load impedance is a series of the inductor 1030 and the load resistor 1040. Therefore, the voltage across the series inductor 1030 plus the load resistor 1040 is as follows:

$Vo=V_1*(Z*C*s)+V_2*(Z*C*s/2)+V_3*(Z*C*s/4)+V_4*(Z*C*s/8)$, where $1/Z=1/(R_L+L*s)+(C*s)+(C*s/2)+(C*s/4)+(C*s/8)$ or $1/Z=1/(R_L+L*s)+15*C*s/8$. Vo is measured at the capacitor end of the inductor. The voltage on the resistor is the desired output voltage, Vout, and is determined as $Vout=R_L/(R_L+L*s)*Vo$. The final expression for the output voltage Vout is $Vout=R_L*C*s*(V_1+V_2/2+V_3/4+V_4/8)/(1+15*C*s/8*(R_L+L*s))$. If ω=the carrier frequency at the AND gate input and $L*C=8/(15*\omega*\omega)$ (resonance), then the final output voltage at frequency ω is:

$$Vout=(V_1+V_2/2+V_3/4+V_4/8)/(15/8), \text{ or}$$

$$Vout=(16/15)*(V_1/2+V_2/4+V_3/8+V_4/16).$$

Figure 11:
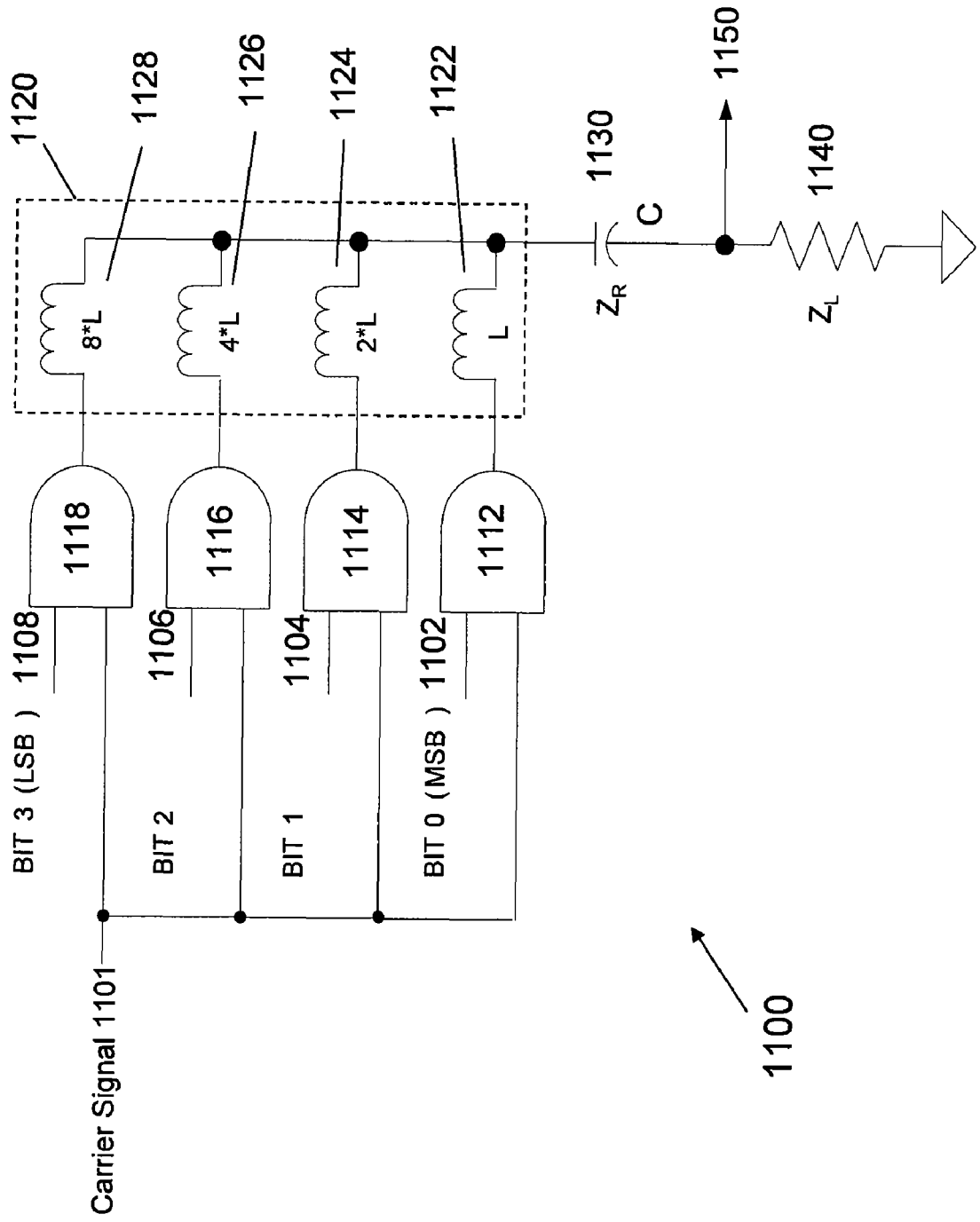
FIG. 11 is a circuit diagram for a binary weighted combiner with identical input carrier signals using inductive weighting and resonated with a capacitor according to one embodiment of the invention.

FIG. 11 is a circuit diagram 1100 for a binary weighted combiner with identical input carrier signals using inductive weighting and resonated with a capacitor according to one embodiment of the invention. The circuit diagram of FIG. 11 is similar to the circuit diagram of FIG. 10 except the capacitors 1022, 1024, 1026 and 1028 have been replaced with inductors 1122, 1124, 1126 and 1128 and the inductor 1030 is replaced with the capacitor 1130. The inductors 1122, 1124, 1126 and 1128 have values of L, 2*L, 4*L, and 8*L, respectively.

The binary weighted values for the inductors are one example of the invention. If an arbitrary weighted ratio is used for each inductor, the output power is determined based on the arbitrary weighted ratios.

Figure 12:
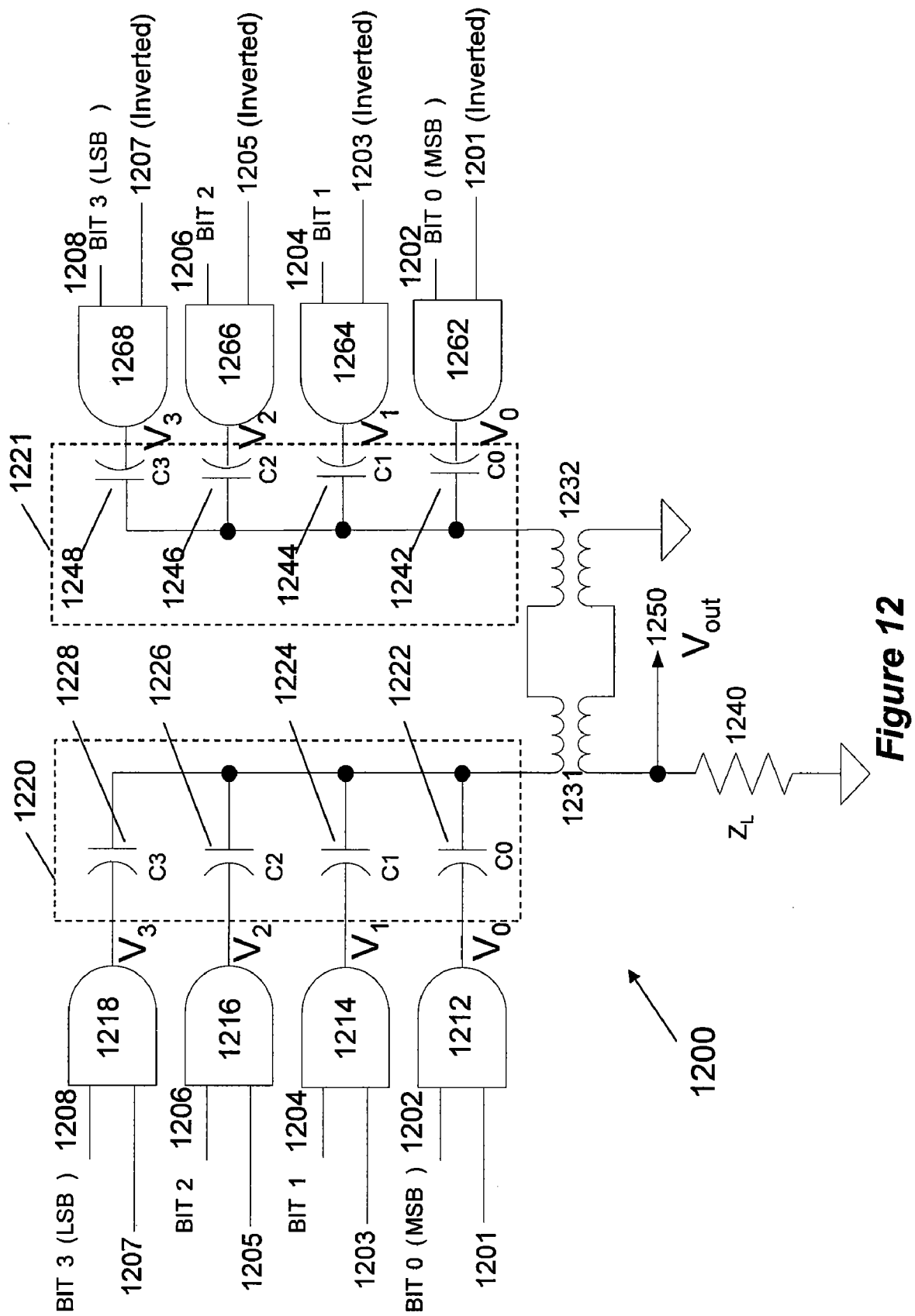
FIG. 12 is a bridge amplifier configuration based on FIG. 7 for providing an increased output power according to one embodiment of the invention.

FIG. 12 is a bridge amplifier configuration based on FIG. 9 for providing an increased output power according to one embodiment of the invention. The capacitive DAC of FIG. 9 is duplicated and the two circuits are coupled together using two inductor pairs 1231 and 1232 (or transformers) coupled together to form the bridge amplifier configuration. The bridge amplifier 1200 of FIG. 12 can product up to 4 times the output power at $V_{out}$ when compared to the capacitive DAC shown in FIG. 9. Each inductor pair 1231 and 1232 (or transformers) has an inductance of L, which is chosen to resonate the combiner circuit. The bridge amplifier 1200 includes two combiner networks 1220 and 1221. Each combiner network 1220 and 1221 can include the same elements (e.g., capacitors) with the same or different weighs. The elements in the combiner networks 1220 and 1221 can be lossy or lossless elements such as capacitors, transformers, inductors, transmission lines, and combinations thereof. As shown, capacitors 1222 and 1242 can have the same capacitance C0, capacitors 1224 and 1244 can have the same capacitance C1, capacitors 1226 and 1246 can have the same capacitance C2 and capacitors 1228 and 1248 can have the same capacitance C3. In various embodiments, the capacitors 1222, 1224, 1226, 1228, 1242, 1244, 1246 and 1248 may have the same or arbitrary capacitance values.

In one or more embodiments, each carrier signal input of each AND gate may have different amplitudes, frequencies and phases, however, similar results of this invention may be realized. As shown in FIG. 12, the carrier signal inputs 1201, 1203, 1205 and 1207 are fed into AND gates 1212, 1214, 1216 and 1218 and inverted carrier signal inputs 1201, 1203, 1205 and 1207 are fed into AND gates 1262, 1264, 1266 and 1268.

Figure 13:
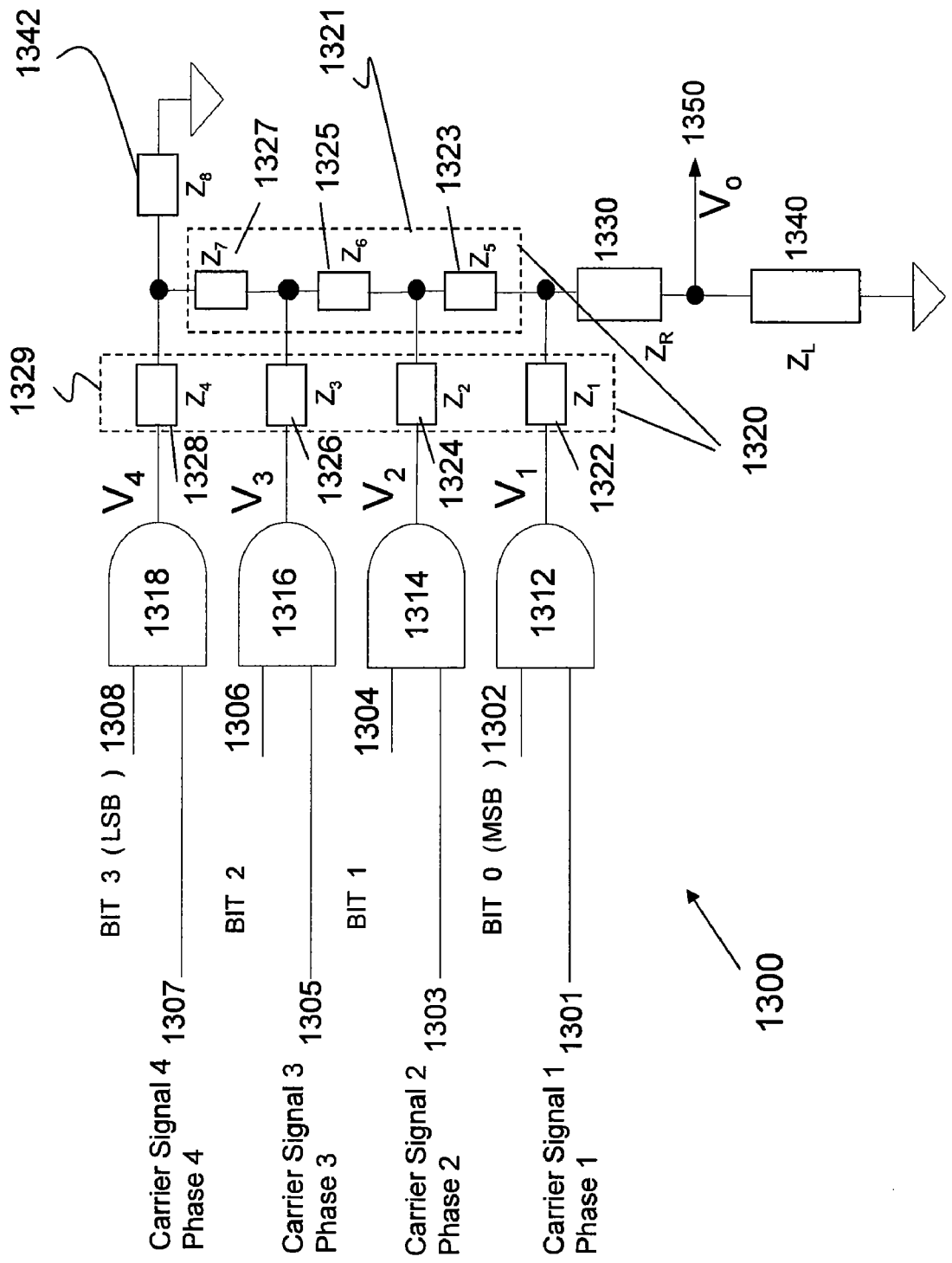
FIG. 13 is a general circuit diagram for an arbitrary weighted combiner using a ladder circuit configuration with different input carrier signals of arbitrary amplitude, frequency and phase according to one embodiment of the invention.

FIG. 13 is a general circuit diagram 1300 for an arbitrary weighted combiner using a ladder circuit configuration with different input carrier signals of arbitrary amplitude, frequency and phase according to one embodiment of the invention. In FIG. 13, carrier signals 1301, 1303, 1305 and 1307 are received at each of AND gates 1312, 1314, 1316 and 1318. Each AND gate also receives digital bits 1302, 1304, 1306 and 1308. Each AND gates 1312, 1314, 1316 and 1318 receives a different or separate carrier signal 1301, 1303, 1305 and 1307 of arbitrary amplitude, frequency and phase. As an example, each carrier signal 1301, 1303, 1305 and 1307 has an arbitrary amplitude, frequency and phase that are different when compared to another carrier signal. That is, carrier signal 1301 may have amplitude V0 and phase P0, carrier signal 1303 may have amplitude V1 and phase P1, carrier signal 1305 may have amplitude V2 and phase P2, and carrier signal 1307 may have amplitude V3 and phase P3. The frequency of each carrier signal 1301, 1303, 1305 and 1307 may also be different from the frequency of another carrier signal. In addition, the output amplitudes $V_1$, $V_2$, $V_3$ and $V_4$ of each gate 1312, 1314, 1316 and 1318 may be arbitrarily set.

Data BIT 0 corresponds to the most significant bit ("MSB") while data bit BIT 3 corresponds to the least significant bit ("LSB"). Thus, each AND gate receives a different carrier input signal 1301, 1303, 1305 or 1307 and a data bit 1302, 1304, 1306 or 1308. The bits turn on the gate with a digital word that is proportional to the amplitude of the output signal.

Approximately the same power is delivered by each gate. The output of the AND gates is received at combiner network 1320 which comprises a plurality of first impedance elements 1329 (e.g., $Z_1$, $Z_2$, $Z_3$ and $Z_4$) and a plurality of second impedance elements 1321 (e.g., $Z_5$, $Z_6$ and $Z_7$). The first and second impedance elements 1329 and 1321 can be any device (s) capable of generating a constant impedance. The total number of second impedance elements 1321 may be 1 less than the total number of first impedance elements 1329. Each impedance element can have an arbitrary impedance value. In one embodiment, there is a one-to-one relationship between the number of AND gates and first impedance elements 1329.

A terminating element 1342 (e.g., $Z_8$) is selected to be consistent with at least one of the impedance elements 1329 of the combiner network 1320. That is, the terminating element 1342 is sized to be similar or equal to the size of at least one of the first impedance elements 1329. As an example, $Z_8$ is equal to $Z_4$ for binary weighting and $Z_8$ is equal to $2*Z_7$ for binary weighting. The circuit 1300 may include a resonating element 1330 and a load impedance element 1340. The output signal 1350 is arbitrarily weighted. The impedances at the voltage source outputs are part of a ladder network and the load impedance 1340 is arbitrary. The voltage across the load impedance 1340 is calculated using superposition.

Figure 14:
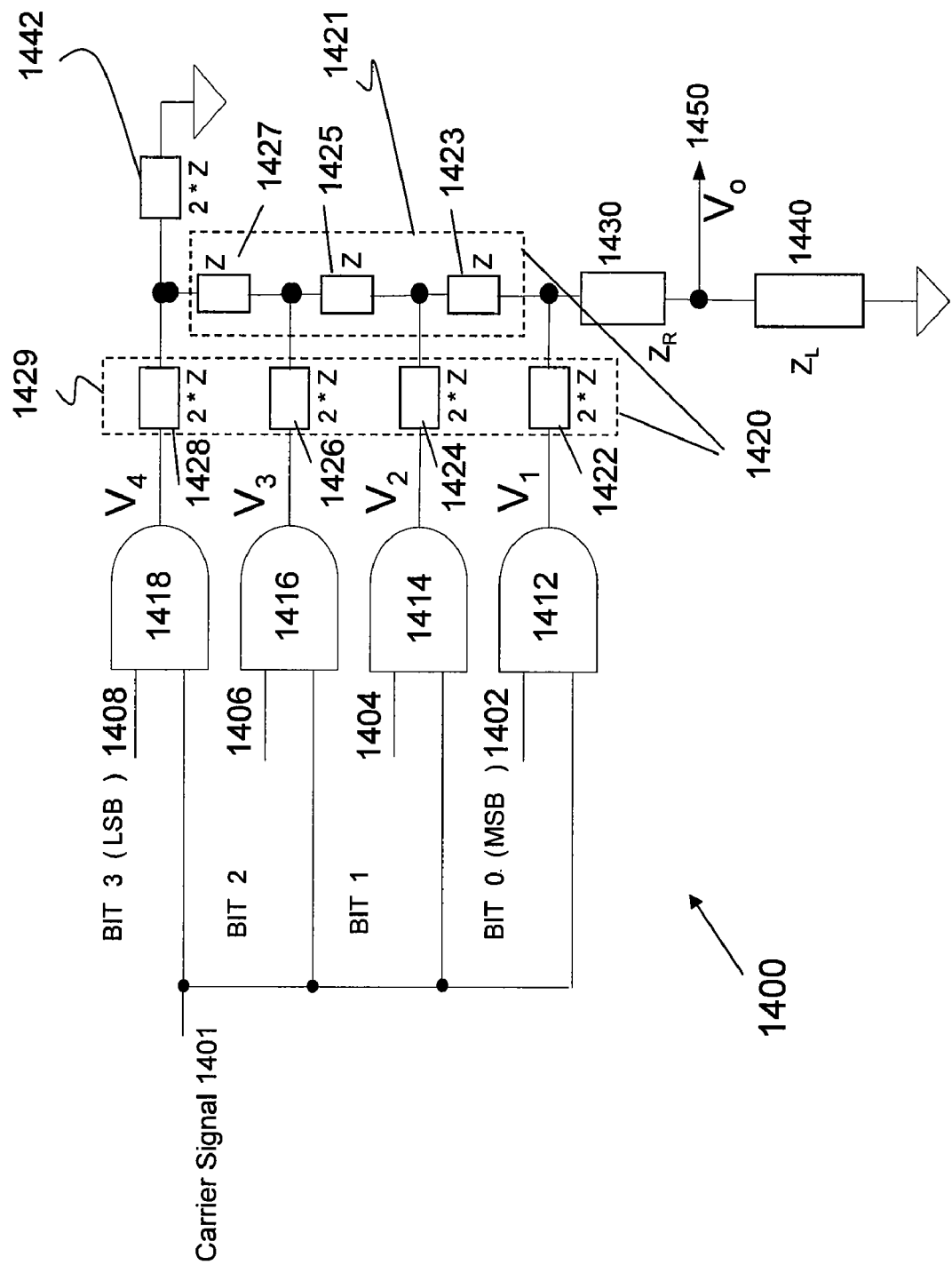
FIG. 14 is a general circuit diagram for a binary weighted combiner using a ladder circuit configuration with identical input carrier signals according to one embodiment of the invention.

FIG. 14 is a general circuit diagram 1400 for a binary weighted combiner using a ladder circuit configuration with identical input carrier signals according to one embodiment of the invention. FIG. 14 is similar to FIG. 13 except the carrier signal 1401 input into the AND gates 1412, 1414, 1416 and 1418 is the same for all the gates. In this example embodiment, the carrier signal 1401 is the same at each gate input. Therefore, all the AND gates 1412, 1414, 1416 and 1418 have an input carrier signal that has the same arbitrary amplitude, frequency and phase. In addition, each impedance element 1422, 1424, 1426 and 1428 belonging to the first impedance elements 1429 have the same impedance (e.g., 2*Z) and each impedance element 1423, 1425 and 1427 belonging to the second impedance elements 1421 have the same impedance (e.g., Z). Also, the terminating element 1442 is sized (e.g., 2*Z) to be similar or equal to the size of at least one of the first impedance elements 1429. The circuit 1400 may include a resonating element 1430 and a load impedance element 1440.

Figure 15:
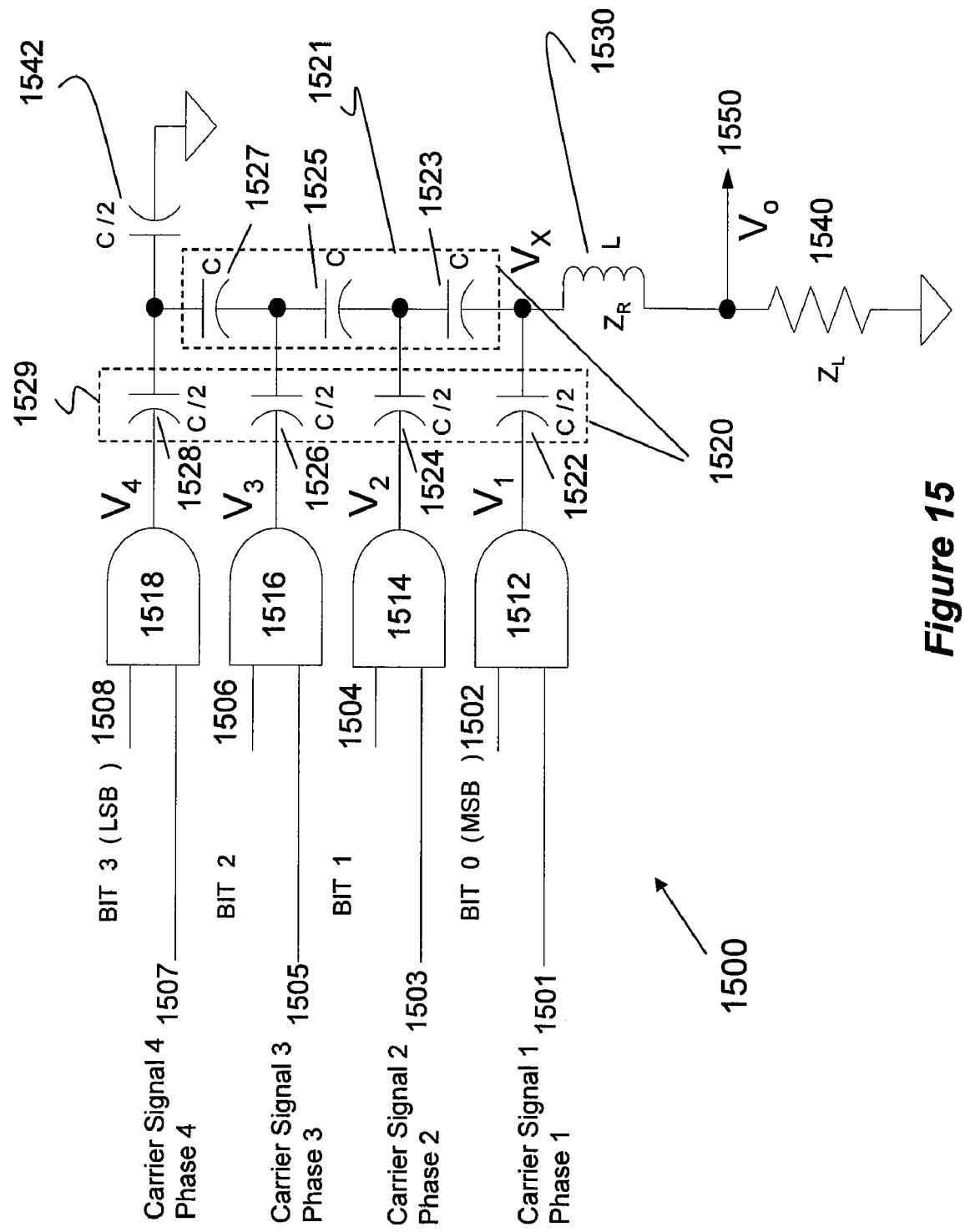
FIG. 15 is a circuit diagram for a binary weighted combiner using a ladder circuit configuration with different input carrier signals of arbitrary amplitude, frequency and phase using capacitive weighting and resonated with an inductor according to one embodiment of the invention.

FIG. 15 is a circuit diagram 1500 for a binary weighted combiner using a ladder circuit configuration with different input carrier signals of arbitrary amplitude, frequency and phase using capacitive weighting and resonated with an inductor according to one embodiment of the invention. In FIG. 15, a different carrier signal 1501, 1503, 1505 and 1507 is received at each of AND gates 1512, 1514, 1516 and 1518. Each AND gate also receives digital bits 1502, 1504, 1506 and 1508. The output of the AND gates 1512, 1514, 1516 and 1518 is received at the combiner network 1520, which comprises a plurality of first lossless elements 1529 and a plurality of second lossless elements 1521. The first lossless elements 1529 are capacitors 1522, 1524, 1526 and 1528. The second lossless elements 1521 are capacitors 1523, 1525 and 1527. There is a one-to-one relationship between the number of AND gates and the first lossless elements 1529.

The first and second lossless elements 1529 and 1521 can include capacitors, inductors, transmission lines and combinations thereof. In the embodiment of FIG. 15, the capacitors are used as lossless elements for the combiner network 1520. The quantity of first lossless elements 1529 and second lossless elements 1521 are related to each other according to the following relationship:

$$B = A - 1 \quad (2)$$

In Equation 2, A is the number of first lossless elements 1529 and B is the number of second lossless elements 1521. In addition, the capacitors of the first lossless elements 1529 have a capacitance which is about half or exactly half of the capacitance of the second lossless elements 1521. By way of example, the capacitance of capacitor 1522 is C/2 which is exactly half of the capacitance C of capacitor 1523. The ladder capacitive DAC shown in FIG. 15 is a C/2C ladder.

A terminating element 1542 is selected to be consistent with the lossless elements 1529 and 1521 of the combiner network 1520. The terminating element 1542 is sized to be similar or equal to the size of at least one of the first lossless elements 1529. Thus, the terminating element 1542 has a capacitance of C/2. The resonating element 1530 is an inductor, which is also a lossless element. The circuit of FIG. 15 provides binary weighting of the carrier signals at the load resistor 1540. The output signal 1550 is weighted linearly.

In the ladder DAC of FIG. 15, according to this embodiment, output linearity is a function of only two capacitor values (i.e., C and C/2) which is easy to control. The same two capacitor values can be used regardless of the number bits received by the circuit. As with the previous embodiment, the use of lossless elements leads to high conversion efficiency. Further tuning for resonance can also increase conversion efficiency. Finally, wide bandwidth is achieved through low circuit Q.

The impedances at the voltage source outputs are part of a ladder network and the load impedance 1540 is arbitrary. The voltage across the load impedance 1540 is calculated using superposition. For illustrative purposes, this assumes only one voltage source is operating for each calculation. The contribution from each voltage source is as follows:

Assume the resonating impedance $Z_R=-Z$, then $Vo=(V_4/16)$, $Vo=(V_3/8)$, $Vo=(V_2/4)$ and $Vo=(V_1/2)$. Summing all the contributions of the voltage at the capacitor end of the inductor results in $Vo=(V_4/16)+(V_3/8)+(V_2/4)+(V_1/2)$. The equation shows the binary weighting of the voltage sources. The actual output voltage value only depends on the load impedance 1340 and the ladder impedance Z.

The impedances at the voltage source outputs are part of a capacitor ladder network. The load impedance is a series of the inductor 1330 and the load resistor 1340. The impedance can be represented as follows:

$Z_L=R_L+L*s$, $Z=1/(C*s)$, and $Vo=R_L/(R_L+L*s)*V$. Then, $V_X=((V/2)+(V_2/4)+(V_3/8)+(V_4/16))*R_L/(1/(C*s)++L*s)$ and assuming $s=j*\omega$, $Vo=((V_1/2)+(V_2/4)+(V_3/8)+(V_4/16))*R_L*j*C*\omega/(1+R_L*j*C*\omega-L*C*\omega*\omega)$.

At resonance, $L*C=\omega*\omega$ and $Vo=(V_1/2)+(V_2/4)+(V_3/8)+(V_4/16)$.

Figure 16:
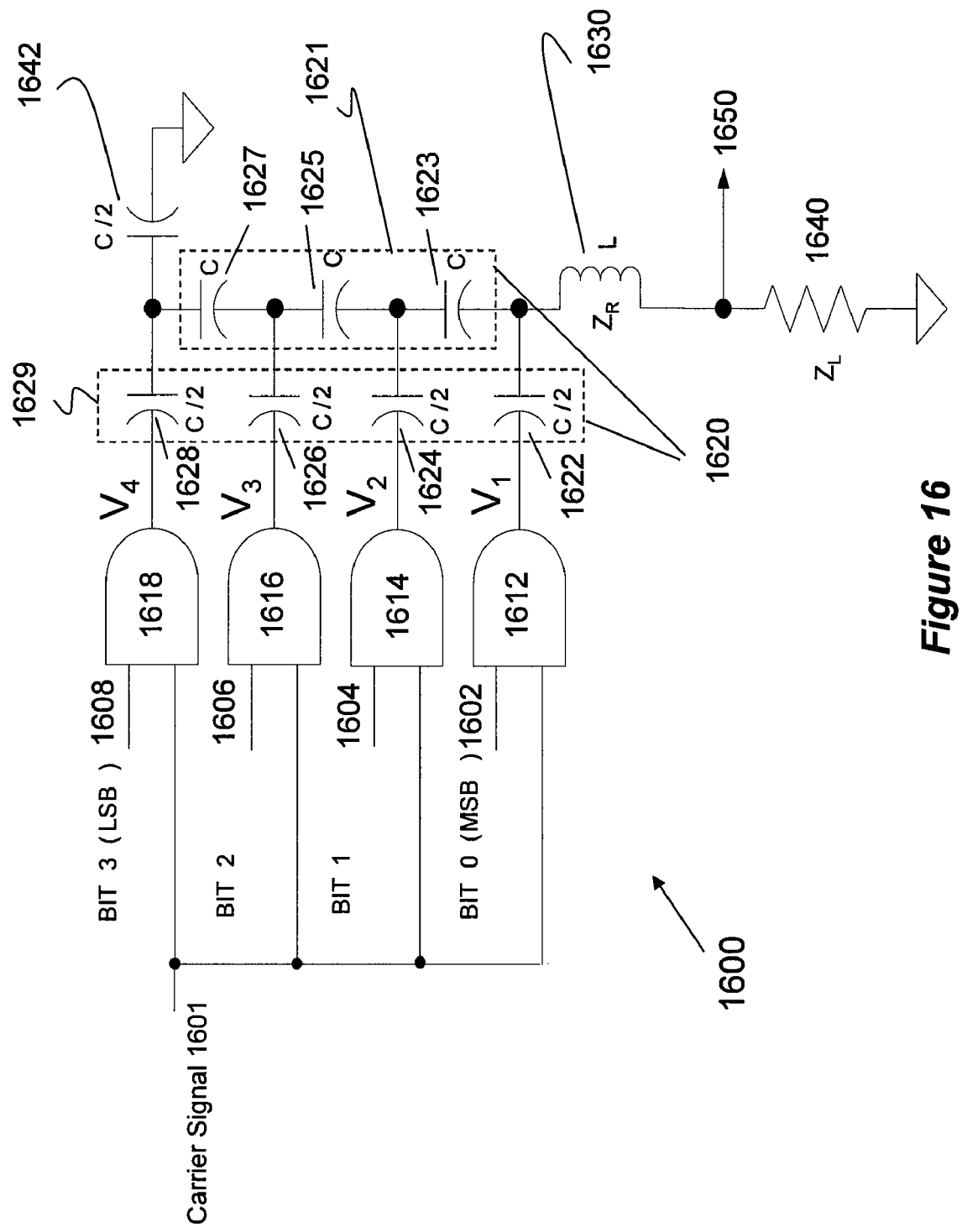
FIG. 16 is a circuit diagram for a binary weighted combiner using a ladder circuit configuration with identical input carrier signals using capacitive weighting and resonated with an inductor according to one embodiment of the invention.

FIG. 16 is a circuit diagram 1600 for a binary weighted combiner using a ladder circuit configuration with identical input carrier signals using capacitive weighting and resonated with an inductor according to one embodiment of the invention. FIG. 16 is similar to FIG. 15 except the carrier signal 1601 input into the AND gates 1612, 1614, 1616 and 1618 is the same for all the gates. In this example embodiment, the carrier signal 1601 is the same at each gate input. Therefore, all the AND gates 1612, 1614, 1616 and 1618 have an input carrier signal that has the same arbitrary amplitude, frequency and phase.

Figure 17:
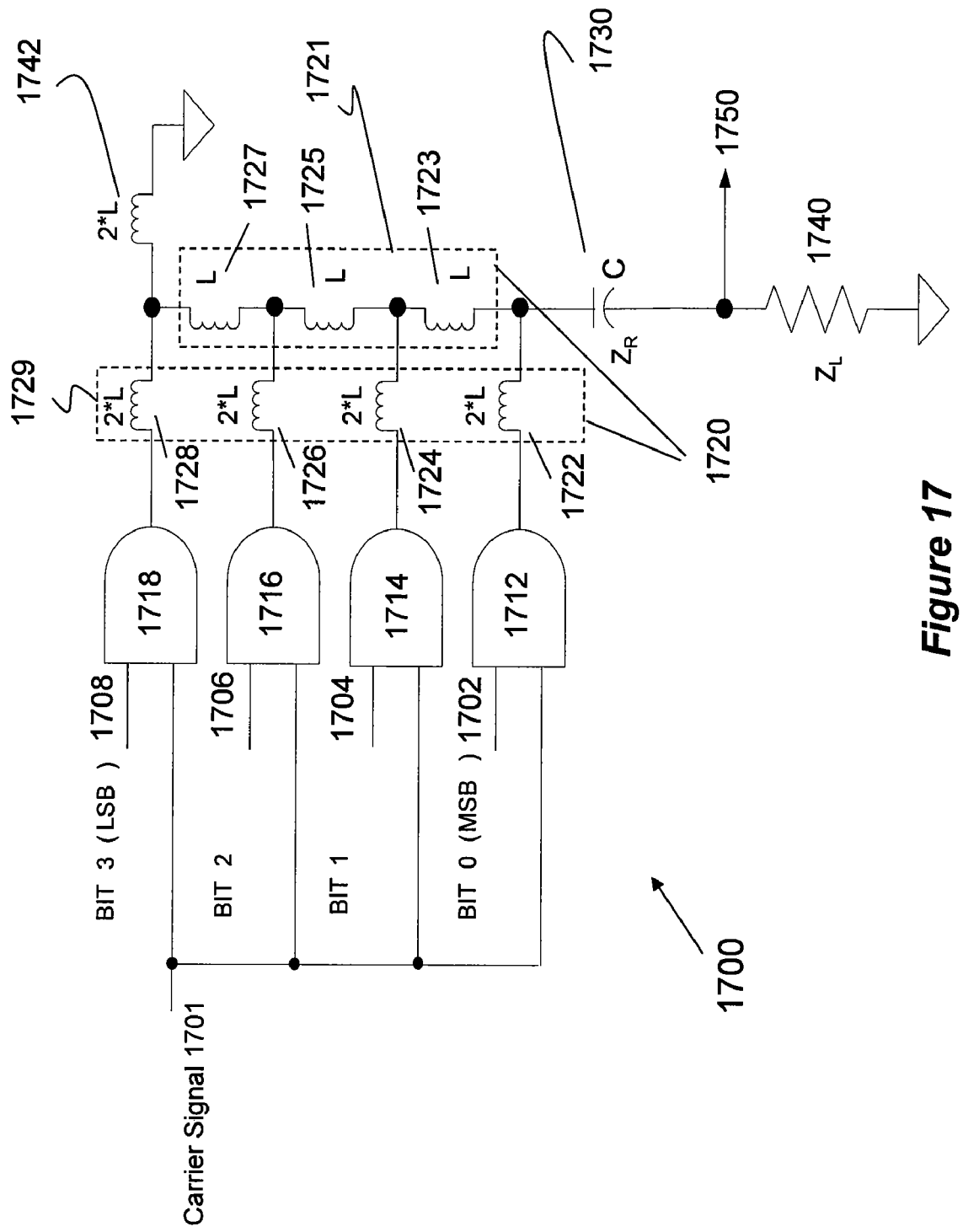
FIG. 17 is a circuit diagram for a binary weighted combiner using a ladder circuit configuration with identical input carrier signals using inductive weighting and resonated with a capacitor according to one embodiment of the invention.

FIG. 17 is a circuit diagram 1700 for a binary weighted combiner using a ladder circuit configuration with identical input carrier signals using inductive weighting and resonated with a capacitor according to one embodiment of the invention. The circuit diagram of FIG. 17 is similar to the circuit diagram of FIG. 16 except the capacitors 1622, 1623, 1624, 1625, 1626, 1627, 1628, and 1642 in FIG. 16 have been replaced with inductors 1722, 1723, 1724, 1725, 1726, 1727, 1728, and 1742 in FIG. 17 and the inductor 1630 is replaced with the capacitor 1730. The inductors 1722, 1723, 1724, 1725, 1726, 1727, 1728, and 1742 have values of 2*L, L, 2*L, L, 2*L, L, 2*L, and 2*L, respectively. The ladder inductive DAC is a 2L/L ladder.

Figure 18:
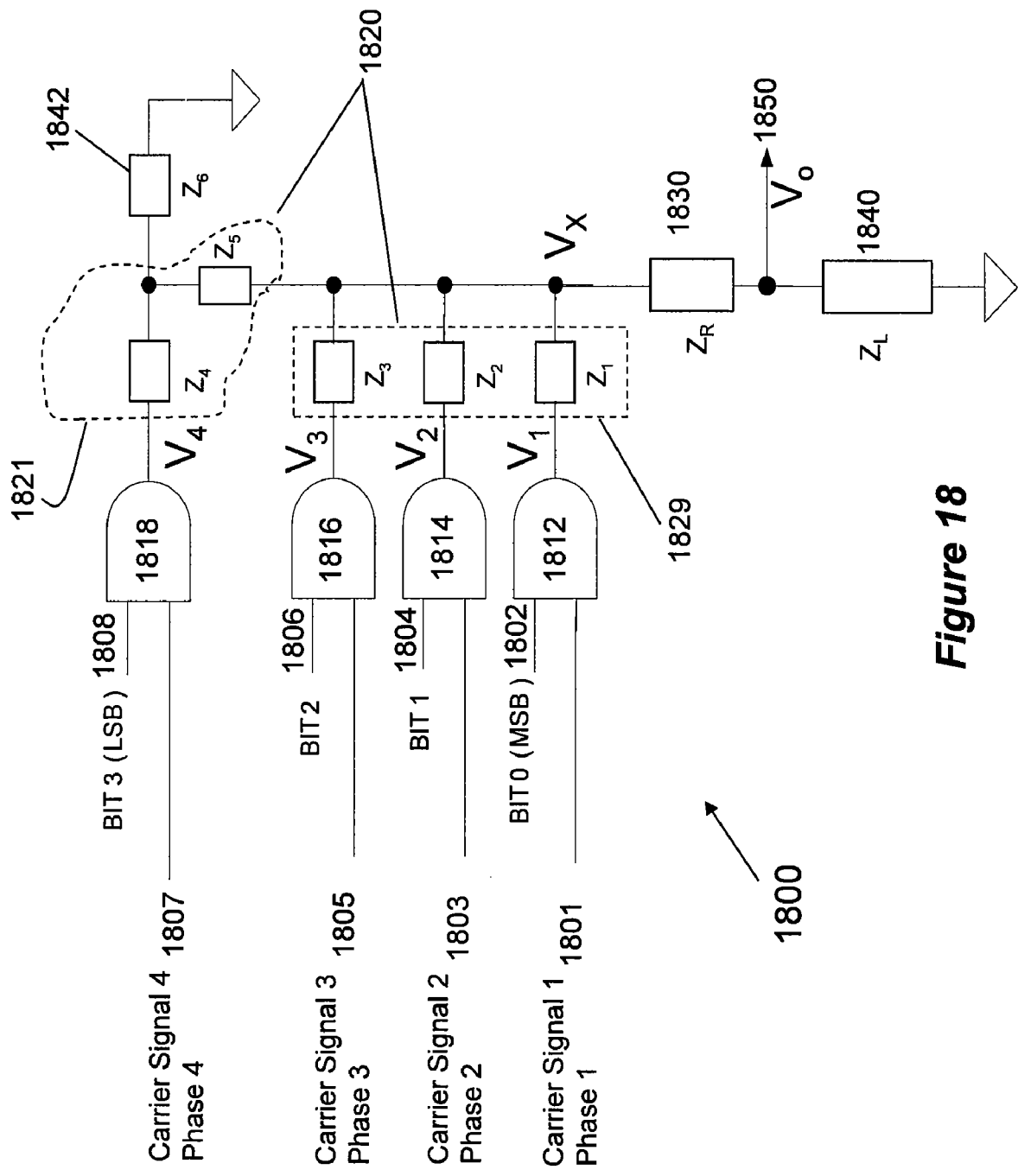
FIG. 18 is a general circuit diagram for an arbitrary weighted combiner using a hybrid circuit configuration with different input carrier signals of arbitrary amplitude, frequency and phase according to one embodiment of the invention.

FIG. 18 is a general circuit diagram 1800 for an arbitrary weighted combiner using a hybrid circuit configuration with different input carrier signals of arbitrary amplitude, frequency and phase according to one embodiment of the invention. The embodiment of FIG. 18 combines some of the features of FIGS. 7 and 13 and uses impedance elements to achieve an arbitrary weighting of the output of several gates to construct a resonant or bandpass DAC.

In FIG. 18, carrier signals 1801, 1803, 1805 and 1807 are received at each of AND gates 1812, 1814, 1816 and 1818. Each AND gate also receives digital bits 1802, 1804, 1806 and 1808. Each AND gates 1812, 1814, 1816 and 1818 receives a different or separate carrier signal 1801, 1803, 1805 and 1807 of arbitrary amplitude, frequency and phase. As an example, each carrier signal 1801, 1803, 1805 and 1807 has an arbitrary amplitude, frequency and phase that are different when compared to another carrier signal. That is, carrier signal 1801 may have amplitude V0 and phase P0, carrier signal 1803 may have amplitude V1 and phase P1, carrier signal 1805 may have amplitude V2 and phase P2, and carrier signal 1807 may have amplitude V3 and phase P3. The frequency of each carrier signal 1801, 1803, 1805 and 1807 may also be different from the frequency of another carrier signal. In addition, the output amplitudes $V_1$, $V_2$, $V_3$ and $V_4$ of each gate 1812, 1814, 1816 and 1818 may be arbitrarily set.

Data BIT 0 corresponds to the most significant bit ("MSB") while data bit BIT 3 corresponds to the least significant bit ("LSB"). Thus, each AND gate receives a different carrier input signal 1801, 1803, 1805 or 1807 and a data bit 1802, 1804, 1806 or 1808. The bits turn on the gate with a digital word that is proportional to the amplitude of the output signal.

The output of the AND gates is received at the combiner network 1820 which comprises a plurality of first impedance elements 1829 (e.g., $Z_1$, $Z_2$ and $Z_3$) and a plurality of second impedance elements 1821 (e.g., $Z_4$ and $Z_5$). The first and second impedance elements 1829 and 1821 can be any device(s) capable of generating a constant impedance. Each impedance element can have an arbitrary impedance value.

A terminating element 1842 (e.g., $Z_6$) is selected to be consistent with at least one of the impedance elements 1829 or 1821 of the combiner network 1820. That is, the terminating element 1842 is sized to be similar or equal to the size of at least one of the first impedance elements 1829 or the second impedance elements 1821. The circuit 1800 may include a resonating element 1830 and a load impedance element 1840. The output signal 1850 is arbitrarily weighted. The impedances at the voltage source outputs are part of a hybrid network and the load impedance 1840 is arbitrary. The voltage across the load impedance 1840 is calculated using superposition.

Figure 19:
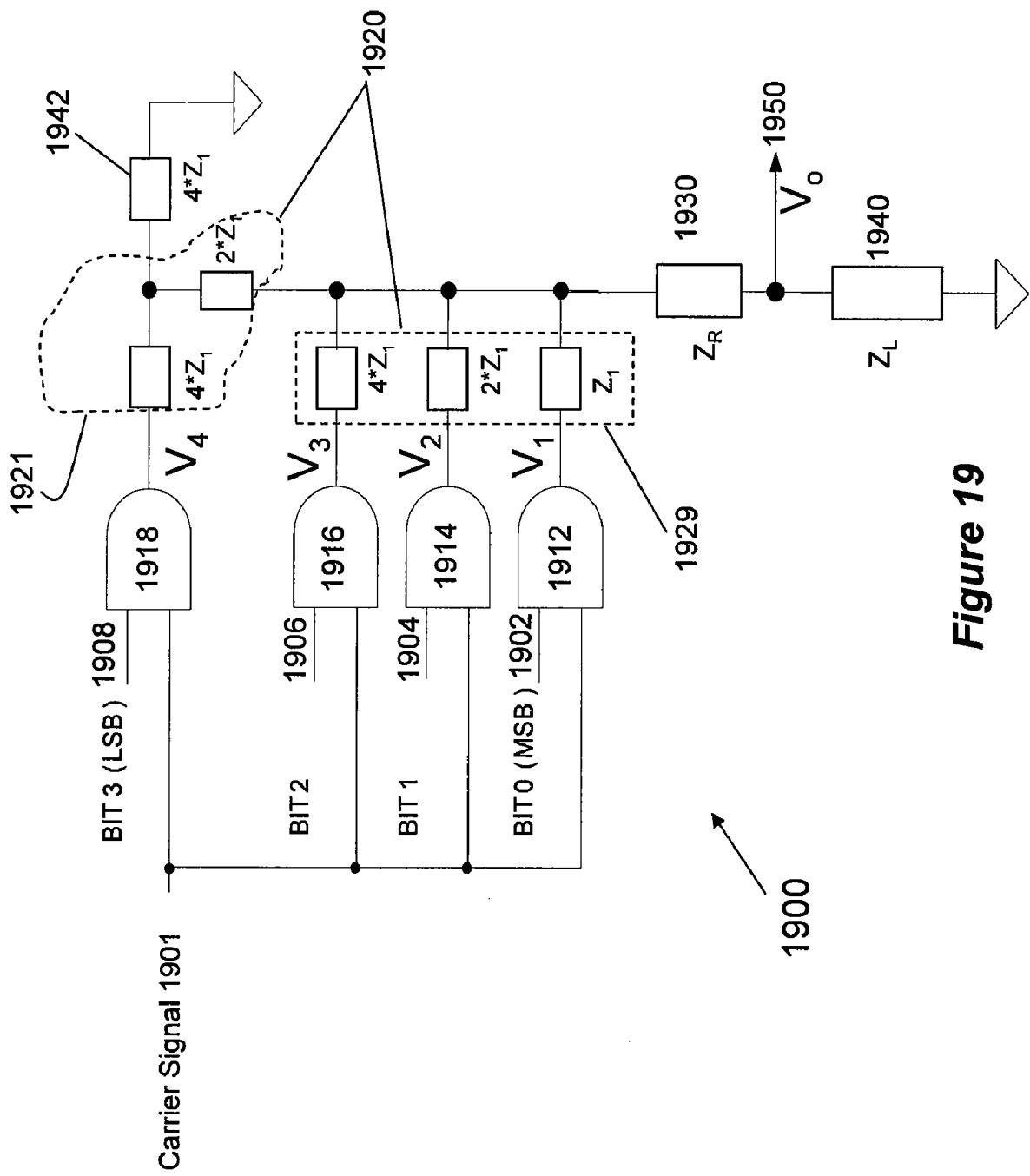
FIG. 19 is a general circuit diagram for a binary weighted combiner using a hybrid circuit configuration with identical input carrier signals according to one embodiment of the invention.

FIG. 19 is a general circuit diagram 1900 for a binary weighted combiner using a hybrid circuit configuration with identical input carrier signals according to one embodiment of the invention. FIG. 19 is similar to FIG. 18 except the carrier signal 1901 input into the AND gates 1912, 1914, 1916 and 1918 is the same for all the gates. In this example embodiment, the carrier signal 1901 is the same at each gate input. Therefore, all the AND gates 1912, 1914, 1916 and 1918 have an input carrier signal that has the same arbitrary amplitude, frequency and phase. In addition, each impedance element has a binary weighting. Also, the terminating element 1942 is sized (e.g., $4*Z_1$) to be similar or equal to the size of at least one of the first impedance elements 1929 or the second impedance elements 1921. The circuit 1900 may include a resonating element 1930 and a load impedance element 1940.

Referring to FIGS. 18 and 19, bit 3 (LSB) is combined using a ladder type DAC structure with bits 2, 1, and 0, which are configured in a binary weighted manner. The contribution from each voltage source is as follows:

$V_X=(V_4/2)*Z/Z_3$ (ladder DAC term), $V_X=V_3*Z/Z_3$ (binary weighted DAC term), $V_X=V_2*Z/Z_2$ (binary weighted DAC term), and $V_X=V_1*Z/Z_1$ (binary weighted DAC term), where $Z=1/(1/Z_L+1/Z_1+1/Z_2+2/Z_3)$.

Summing all the contributions of the voltage results in $V_X=(V_4/2)*Z/Z_3+V_3*Z/Z_3+V_2*Z/Z_2+V_1*Z/Z_1$. The contribution from $V_4$ behaves like the contribution from a ladder DAC while the contributions from $V_3$, $V_2$, and $V_1$ behave like the contribution from a binary weighted DAC. The final output voltage is $Vo=Z_L/(Z_L+Z_R)*V_X$.

Now $Z_2=2*Z_1$ and $Z_3=2*Z_2$ or $4*Z_1$. Continuing with a longer DAC would set the maximum impedance in the DAC at $Z_3$ or $4*Z_1$, which is important in an RF environment.

Figure 20:
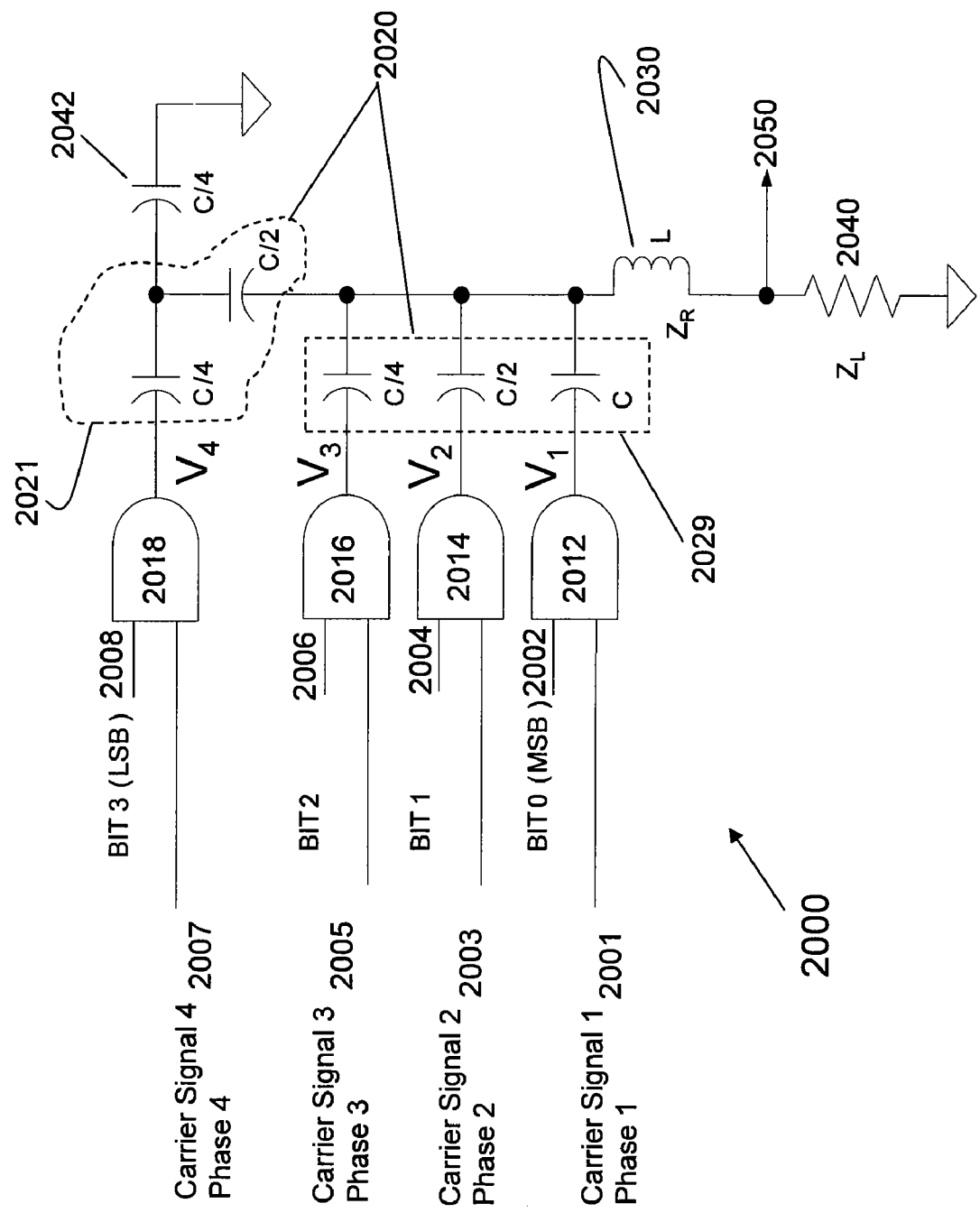
FIG. 20 is a circuit diagram for a binary weighted combiner using a hybrid circuit configuration with different input carrier signals of arbitrary amplitude, frequency and phase using capacitive weighting and resonated with an inductor according to one embodiment of the invention.

FIG. 20 is a circuit diagram 2000 for a binary weighted combiner using a hybrid circuit configuration with different input carrier signals of arbitrary amplitude, frequency and phase using capacitive weighting and resonated with an inductor according to one embodiment of the invention. As in the previous embodiments, the AND gates 2012, 2014, 2016 and 2018 receive different carrier signals (e.g., 2001, 2003, 2005 and 2007) as described above.

The first and second lossless elements 2029 and 2021 are capacitors. The first lossless elements 2029 decrease in capacitance corresponding to the decrease in bit significance. In other words, the output of AND gate 2012 (which receives MSB 2002) is directed to a capacitor with capacitance C. Similarly, the outputs from AND gates 2014 and 2016 are directed to capacitors having capacitance of C/2 and C/4, respectively. Thus, capacitance decreases according to Equation 1.

The second lossless elements 2021 are selected in the manner discussed in relation to FIG. 15. In the embodiment of FIG. 20, only two capacitors are shown as the second lossless elements 2021. However, the inventive principles are not limited thereto and additional capacitors can be added as shown in FIG. 15.

The terminating element 2042 is a capacitor and its capacitance is substantially identical to the capacitor receiving the output of AND gate 2018. It is noted that the terminating element 2042 is also a lossless element. In the embodiment of FIG. 20, the power supplied to the AND gates is substantially constant for the second lossless elements 2021 of the combiner network 2020.

In FIG. 20, the output level is a function of binary weighted capacitors from MSB down to a predetermined bit significance. The output level for the lower order bits is determined by capacitors having the relationship C and C/2, which limits the number of capacitance values. Power delivered to each AND gate drops for the binary weighted bits (i.e., BIT 0, BIT 1 and BIT 2), and then it remains constant for the gates corresponding to the remaining lower order bits. As in the previous embodiments, the use of lossless elements leads to high conversion efficiency and tuning for resonance can increase the efficiency even further. Finally, the low circuit Q achieves wide bandwidth. The resonating element 2030 and the load resistor 2040 operate in the same manner as the previous embodiments to provide output voltage 2050.

Figure 21:
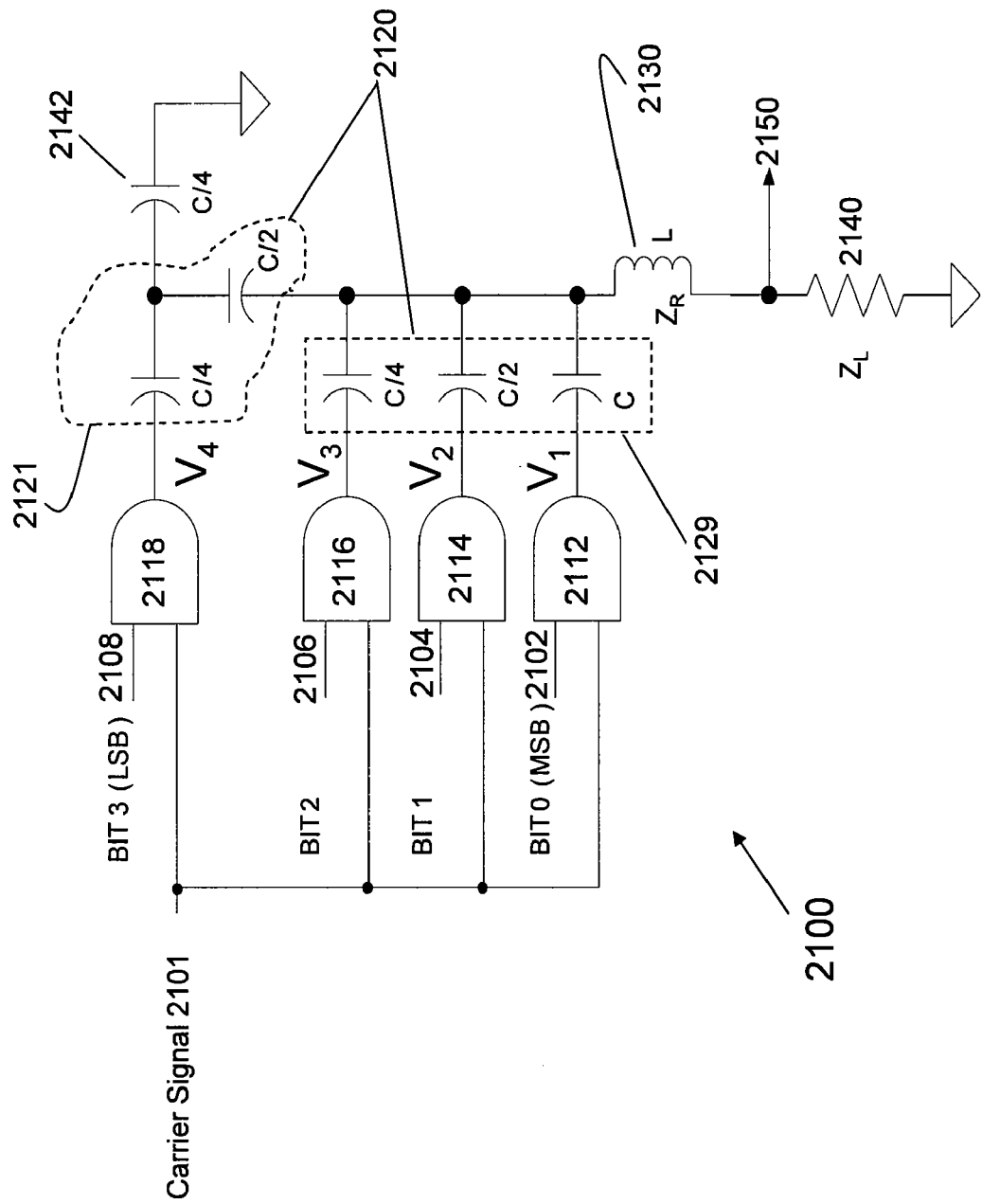
FIG. 21 is a circuit diagram for a binary weighted combiner using a hybrid circuit configuration with identical input carrier signals using capacitive weighting and resonated with an inductor according to one embodiment of the invention.

FIG. 21 is a circuit diagram 2100 for a binary weighted combiner using a hybrid circuit configuration with identical input carrier signals using capacitive weighting and resonated with an inductor according to one embodiment of the invention. FIG. 21 is similar to FIG. 20 except the carrier signal 2101 input into the AND gates 2112, 2114, 2116 and 2118 is the same for all the gates. In this example embodiment, the carrier signal 2101 is the same at each gate input. Therefore, all the AND gates 2112, 2114, 2116 and 2118 have an input carrier signal that has the same arbitrary amplitude, frequency and phase. Elements 2112, 2114 and 2116 may be referred to as first constant impedance sources and element 2118 may be referred to as a second constant impedance source.

Figure 22:
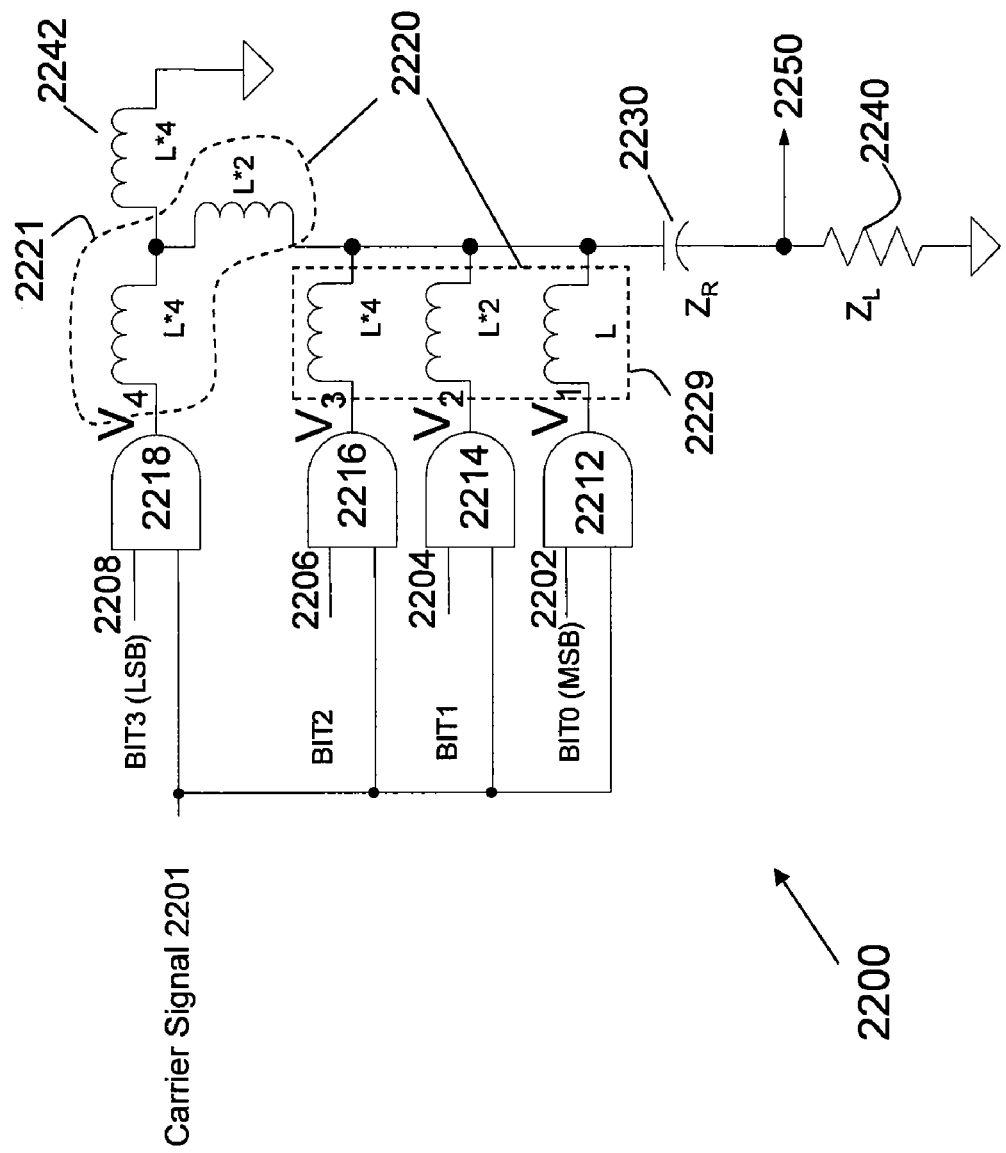
FIG. 22 is a circuit diagram for a binary weighted combiner using a hybrid circuit configuration with identical input carrier signals using inductive weighting and resonated with a capacitor according to one embodiment of the invention.

FIG. 22 is a circuit diagram 2200 for a binary weighted combiner using a hybrid circuit configuration with identical input carrier signals using inductive weighting and resonated with a capacitor according to one embodiment of the invention. FIG. 22 is a circuit diagram for a hybrid inductive DAC which uses inductors as lossless elements for the combiner network according to one embodiment of the invention. In FIG. 22, each of AND gates 2212, 2214, 2216 and 2218 receives a data input as well as the carrier signal 2201. The AND gates' outputs are directed to the combiner network 2220. The combiner network 2220 comprises a plurality of first lossless elements 2229 and a plurality of second lossless elements 2221.

In contrast with the combiner network 2120 of FIG. 21, the lossless elements of the combiner network 2220 of FIG. 22 are inductors. The inductors are selected similar to the capacitors of FIG. 21 and the inductance value for each inductor is indicated on FIG. 22. The terminating inductor 2242 is coupled to the second lossless elements 2221. The capacitor 2230 is placed in series with the output 2250 to resonate the DAC inductance. This results in the binary weighting of the amplitude of the carrier signal 2201 at the load resistor 2240. The weighting is linear.

Figure 23:
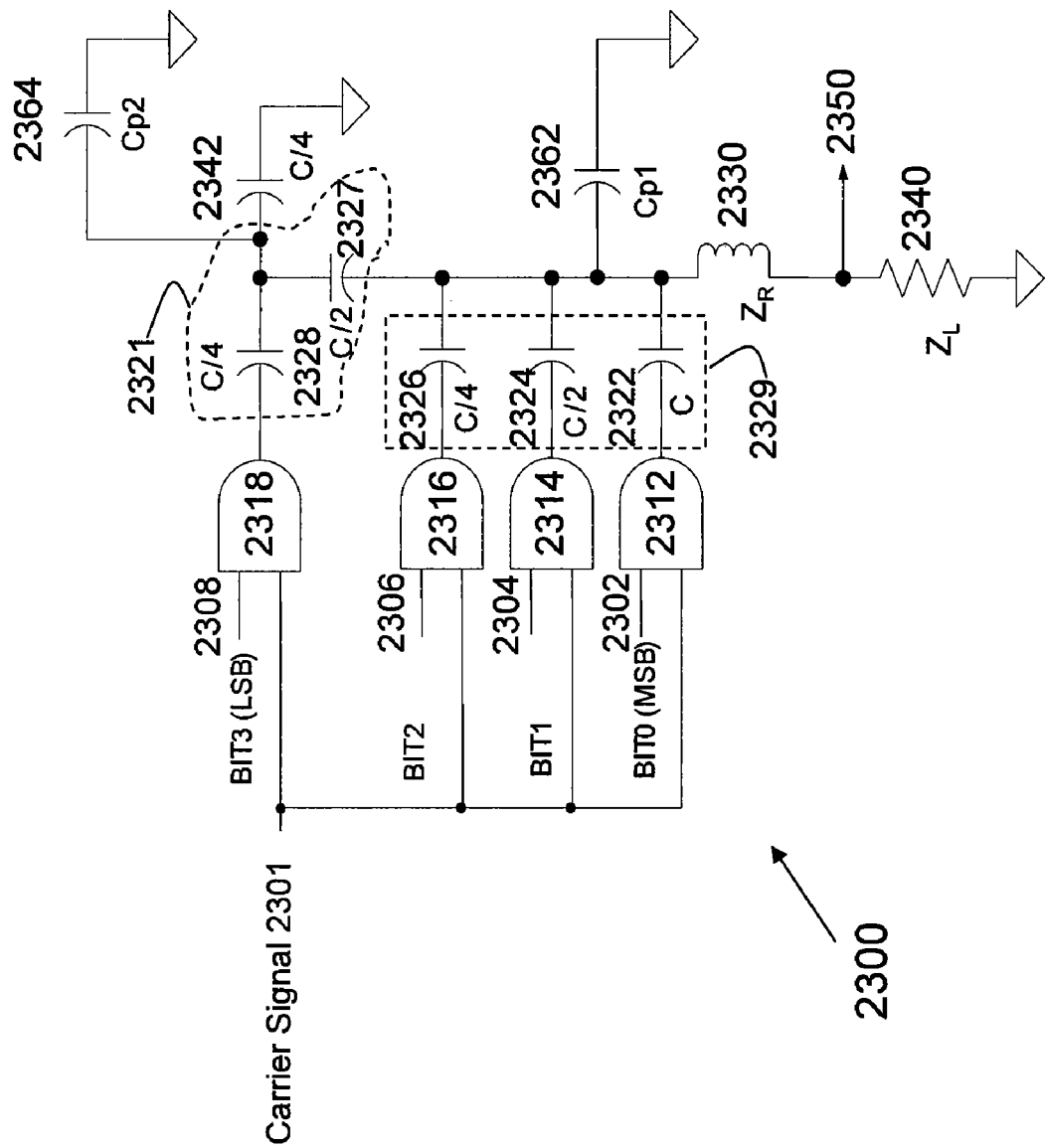
FIG. 23 is a circuit diagram for a binary weighted combiner using a hybrid circuit configuration with identical input carrier signals using capacitive weighting and resonated with an inductor and illustrates the effects of parasitic capacitances according to one embodiment of the invention.

FIG. 23 is a circuit diagram for a binary weighted combiner using a hybrid circuit configuration with identical input carrier signals using capacitive weighting and resonated with an inductor and illustrates the effects of parasitic capacitances according to one embodiment of the invention. The circuit of FIG. 23 is identical to the circuit of FIG. 21, except that parasitic capacitors 2362 and 2364 have been added. Each AND gate 2312, 2314, 2316 and 2318 receives a data bit and the carrier signal 2301. The AND gates' outputs are directed to a combiner network having a plurality of first lossless elements 2329 and a plurality of second lossless elements 2321. In the exemplary embodiment of FIG. 23, the lossless elements 2329 and 2321 are capacitors. The terminating capacitor 2342 is connected to the second lossless elements 2321 and the resonating element 2330 resonates the combined capacitor network. The load resistor 2340 and the output node 2350 remain the same as in FIG. 21.

The parasitic capacitor 2362 does not affect DAC linearity and the only compensation is to adjust C for the minimal capacitive value. The parasitic capacitor 2364 is compensated by adjusting the value of capacitor 2342 by subtracting the value of capacitor 2364 from the capacitor 2342.

In FIG. 23, the capacitor values are adjusted to compensate for parasitic capacitance by an alternative method. The capacitance value of the various capacitors can be adjusted to obtain new capacitance values. For example, if the initial capacitance values are identical to the values shown in FIG. 21, they can be adjusted to account for the parasitic capacitors 2362 and 2364.

Thus, the capacitance of capacitor 2322 can be adjusted to $C-4*Cp1/7$; the capacitance of capacitor 2324 can adjusted to $C/2-2*Cp1/7$; the capacitance of capacitor 2326 can be adjusted to $C/4-Cp1/7$; the capacitance of capacitor 2327 can be adjusted to $C/2-2*Cp1/7$; the capacitance of capacitor 2328 can be adjusted to $C/4-Cp1/7$. The capacitance of terminating capacitor 2342 can be adjusted to $C/4-Cp2$; where Cp1 denotes the capacitance value of the parasitic capacitor 2362 and where Cp2 denotes the capacitance value of the parasitic capacitor 2364. Cp1 and Cp2 can have the same or different values.

It is noted that the cost of compensating for the parasitic capacitors is a slight loss in output power. However, linearity and bandwidth are not changed. The circuit of FIG. 23 is also a bandpass DAC. As stated, the lossless elements are not limited to capacitors.

Figure 24:
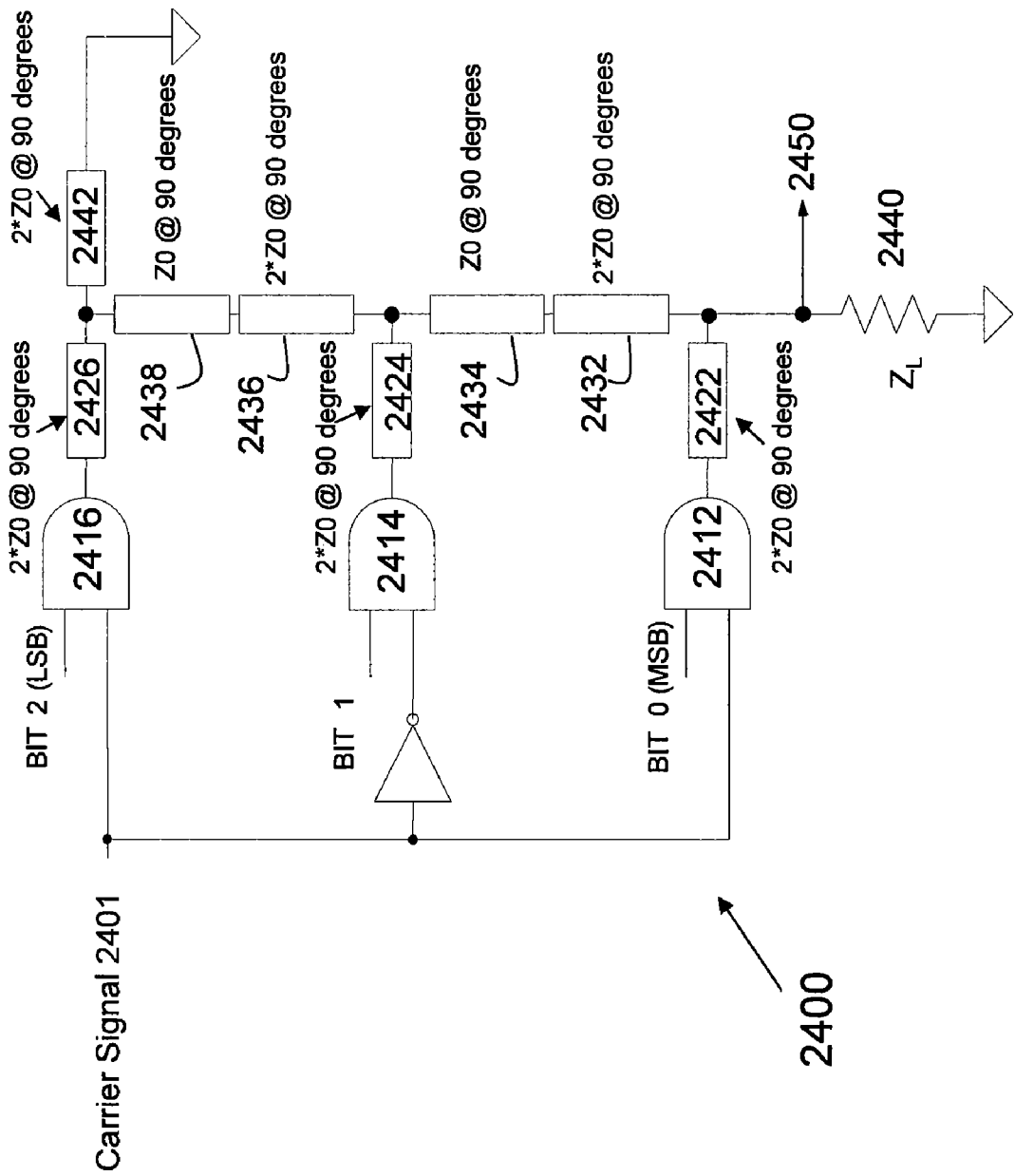
FIG. 24 is a circuit diagram for a ladder bandpass DAC which uses transmission lines as lossless elements according to one embodiment of the invention.

FIG. 24 is a circuit diagram for a ladder bandpass DAC which uses transmission lines as lossless elements according to one embodiment of the invention. The DAC is self resonant due to the use of transmission lines and no additional component (e.g., resonating element) is required. The embodiment of FIG. 24 illustrates a three bit equivalent of the ladder DAC shown in FIG. 14. In FIG. 24, each of AND gates 2412, 2414 and 2416 receives a data bit along with carrier signal 2401. The output of AND gates 2412, 2414 and 2416 is directed to transmission lines 2422, 2424 and 2426, respectively. The transmission lines 2432, 2434, 2436 and 2438 define lossless elements which collectively act as a combiner network. The terminating transmission line 2442 is a 90 degree section of transmission line. The ladder bandpass DAC of FIG. 24 has several unique properties. First, the odd number bits must be driven 180 degrees out of phase by carrier signal 2401 due to the 180 degree delay between the AND gate outputs and the output load. Second, the circuit supports the odd harmonics of the gate outputs, thus supporting a square wave output at the load resistor 2440. Finally, the ladder bandpass DAC has a narrow band with respect to the carrier frequency. FIG. 24 shows exemplary transmission line values and the phase relationship for each transmission line. The output load resistor $Z_L$ is equal to the transmission line impedance Z0.

Figure 25:
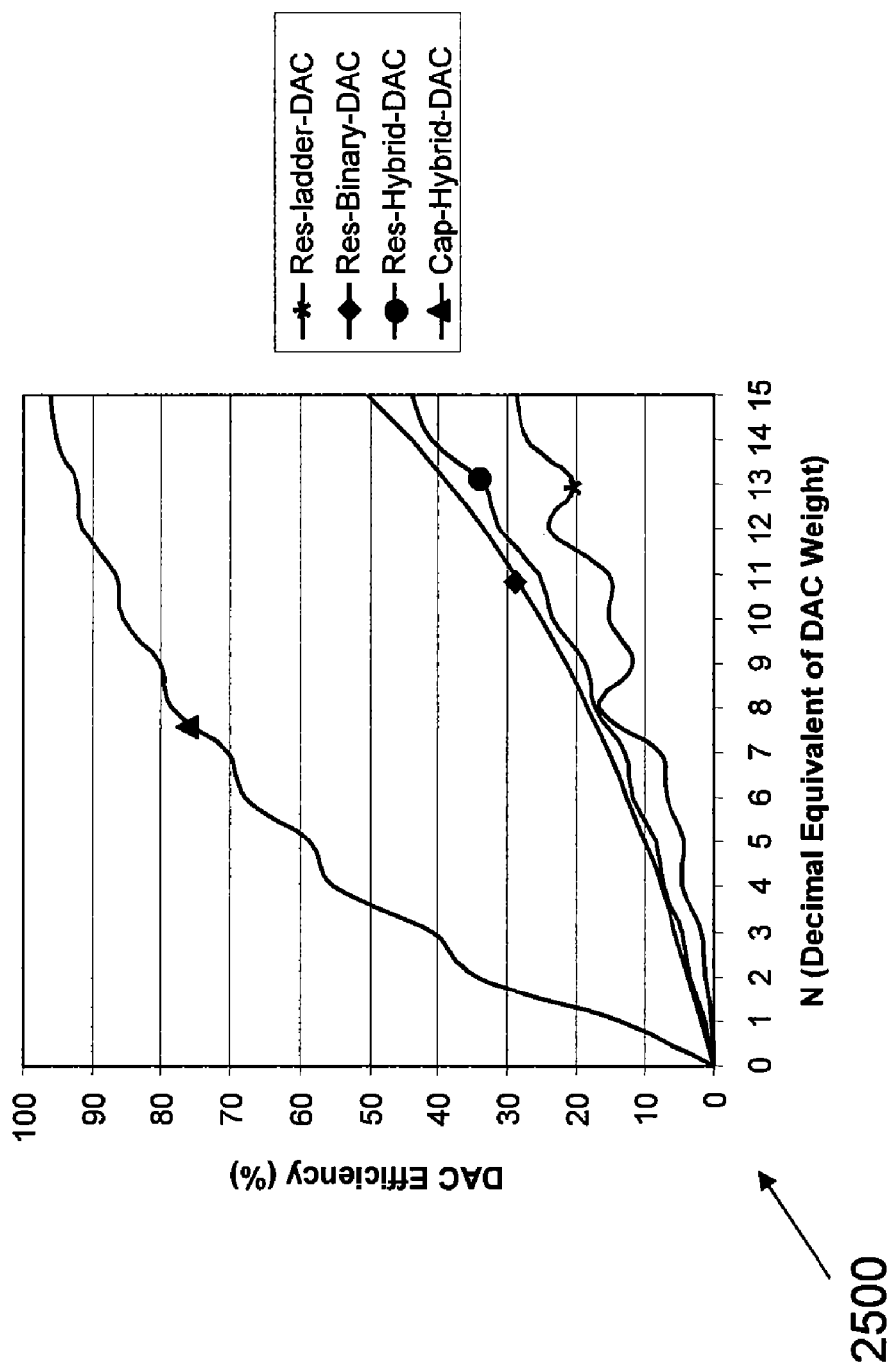
FIG. 25 shows a graph of efficiency values for different types of DACs according to one embodiment of the invention.

FIG. 25 shows a graph 2500 of efficiency values for different types of DACs according to one embodiment of the invention. More specifically, FIG. 25 compares the efficiency of the conventional resistive DACs with a hybrid capacitive DAC according to the disclosed principles. In FIG. 25, the Y-axis shows DAC efficiency and X-axis shows the decimal equivalents for the four binary digits ranging from 0 to 15. Efficiency was measured on three resistive DACs, including a binary weighted DAC, a ladder DAC, and a hybrid DAC all having resistive elements. A hybrid capacitive DAC according to the disclosed embodiments was also tested. FIG. 25 shows the efficiency of each DAC.

As evident, the efficiency of the bandpass DAC according to the disclosed embodiments is superior to the conventional DACs using resistive elements. The efficiency is defined as the ratio of the output power to the sum of the input powers from each bit. In the case of the hybrid capacitor DAC, bits 0, 1, and 2 were binary weighted and bit 3 was added using the ladder configuration. It is evident that the efficiency of the capacitor version, as compared to the conventional resistive version, is greatly improved. In addition, the shape of the efficiency curve of the capacitive hybrid DAC is different. Finally, the efficiency of the capacitive hybrid DAC remained at higher levels as the output was reduced. The hybrid capacitor DAC can also be configured using an opposite structure (i.e., the LSB side can be binary weighted and the MSB side can have a ladder configuration). This configuration provides similar results (e.g., power efficiencies).

The bandpass DACs disclosed herein have the following properties and advantages: (i) weighting of voltage sources can be binary; (ii) the passive weighting elements are lossless, hence there is no power dissipation in the DAC circuitry; (iii) the DAC can be resonated at the carrier frequency and the losses can be even smaller; (iv) the Q of the circuit can be kept very low thereby making the bandwidth very large; (v) the DACs have the potential for better efficiencies than the conventional resistor DACs; and (vi) the capacitive version and the transmission line version of the DACs can compensate for parasitic capacitance.

Figure 26:
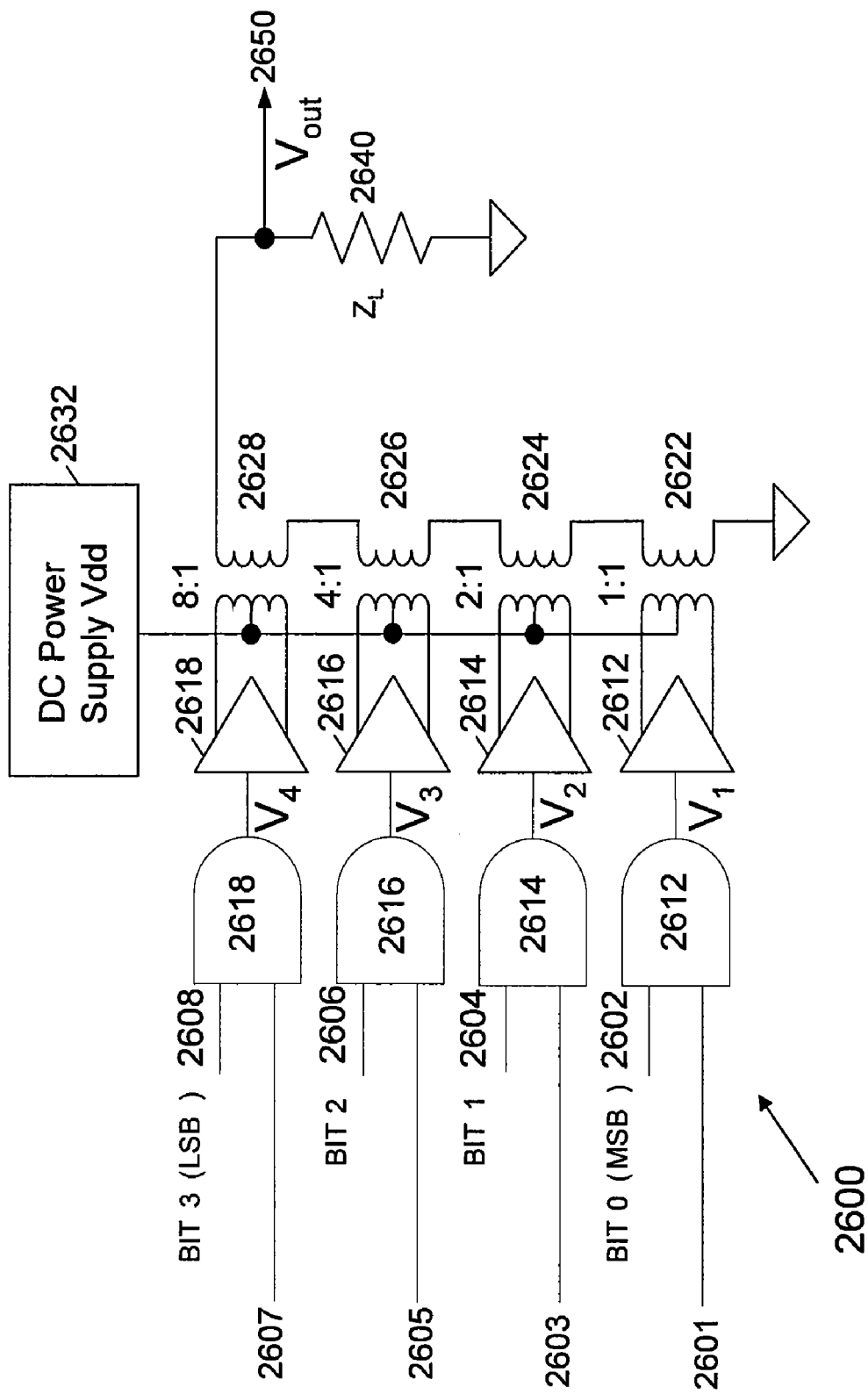
FIG. 26 is a circuit diagram for a binary weighted turns-ratio transformer DAC according to another embodiment of the invention.

FIG. 26 is a circuit diagram for a binary weighted turns-ratio transformer DAC according to another embodiment of the invention. In FIG. 26, each of the AND gates 2612, 2614, 2616 and 2618 receives a data input as well as the carrier signals 2601, 2603, 2605 and 2607. The multiple carrier signals 2601, 2603, 2605 and 2607 can be replaced with a single carrier signal as described above. The AND gates' outputs are directed to a class D voltage mode amplifiers 2612, 2614, 2616 and 2618. The outputs of the class D voltage mode amplifiers 2612, 2614, 2616 and 2618 are each connected to a transformer. That is, the output of amplifier 2612 is connected to transformer 2622, the output of amplifier 2614 is connected to transformer 2624, the output of amplifier 2616 is connected to transformer 2626 and the output of amplifier 2618 is connected to transformer 2628. Each transformer may have a binary weighted or an arbitrary weighted turns ratio. As shown in FIG. 26, the transformer 2622 has a 1:1 turns ratio, the transformer 2624 has a 2:1 turns ratio, the transformer 2626 has a 4:1 turns ratio and the transformer 2628 has an 8:1 turns ratio. In this example, the transformers 2622, 2624, 2626 and 2628 have a binary weighted turns ratio. This results in the binary weighting of the amplitude of the carrier signals 2601, 2603, 2605 and 2607 at the load resistor 2640. The weighting is linear. The transformers 2622, 2624, 2626 and 2628 may be collectively referred to as a combiner network. A DC power supply Vdd 2632 provides power to each of the transformers 2622, 2624, 2626 and 2628.

Figure 27:
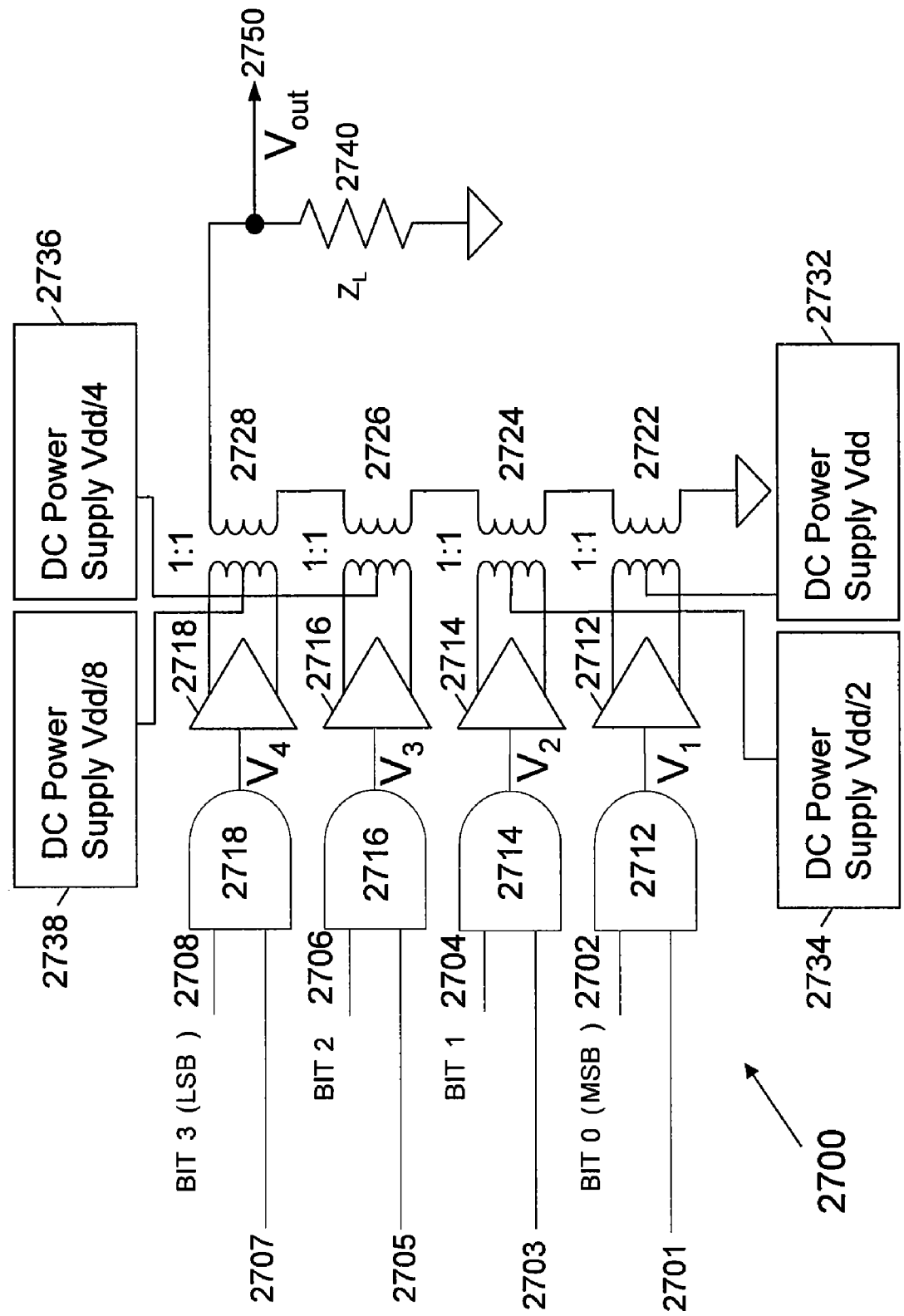
FIG. 27 is a circuit diagram for binary weighted power supply voltages transformer DAC according to another embodiment of the invention.

FIG. 27 is a circuit diagram for binary weighted power supply voltages transformer DAC according to another embodiment of the invention. In FIG. 27, each of the AND gates 2712, 2714, 2716 and 2718 receives a data input as well as the carrier signals 2701, 2703, 2705 and 2707. The multiple carrier signals 2701, 2703, 2705 and 2707 can be replaced with a single carrier signal as described above. The AND gates' outputs are directed to a class D voltage mode amplifiers 2712, 2714, 2716 and 2718. The outputs of the class D voltage mode amplifiers 2712, 2714, 2716 and 2718 are each connected to a transformer. That is, the output of amplifier 2712 is connected to transformer 2722, the output of amplifier 2714 is connected to transformer 2724, the output of amplifier 2716 is connected to transformer 2726 and the output of amplifier 2718 is connected to transformer 2728. Each transformer may have a binary weighted or arbitrary weighted turns ratio. As shown in FIG. 27, the transformer 2722 has a 1:1 turns ratio, the transformer 2724 has a 1:1 turns ratio, the transformer 2726 has a 1:1 turns ratio and the transformer 2728 has a 1:1 turns ratio. In this example, the transformers 2722, 2724, 2726 and 2728 all have the same weighted turns ratio. The transformers 2722, 2724, 2726 and 2728 may be collectively referred to as a combiner network.

Instead of the transformers being binary weighted, the DC power supplies are binary weighted. For example, the DC power supply 2732 has a voltage output to the transformer 2722 of Vdd, the DC power supply 2734 has a voltage output to the transformer 2724 of Vdd/2, the DC power supply 2736 has a voltage output to the transformer 2726 of Vdd/4 and the DC power supply 2738 has a voltage output to the transformer 2728 of Vdd/8. The voltage output from each DC power supply can also be arbitrary.

While the principles of the disclosure have been illustrated in relation to the exemplary embodiments shown herein, the principles of the disclosure are not limited thereto and include any modification, variation or permutation thereof.

What is claimed is:
1. A converter, comprising:
a plurality of constant impedance sources, each constant impedance source having a constant output impedance, each constant impedance source providing an output;
a combiner network having a plurality of impedance elements corresponding to the plurality of constant impedance sources, the combiner network receiving the plurality of outputs and providing a signal;
a resonating element connected to the combiner network for resonating the signal received from the combiner network and providing a filtered output signal;

a load impedance element connected to the resonating element; and an output node connected between the load impedance element and the resonating element, the output node outputting the filtered output signal.

2. The converter of claim 1, wherein each of the plurality of constant impedance sources receives a different carrier signal of arbitrary amplitude and phase and one of a plurality of input bits of a digital data.

3. The converter of claim 1, wherein each of the plurality of impedance elements is selected from a group consisting of a capacitor, an inductor, a resistor, a transmission line, a transformer, and combinations thereof.

4. The converter of claim 1, wherein the resonating element is selected from a group consisting of a capacitor, an inductor, a resistor, a transmission line, a transformer, and combinations thereof.

5. The converter of claim 1, wherein each of the plurality of impedance elements of the combiner network has a binary weight.

6. The converter of claim 1, wherein each of the plurality of impedance elements of the combiner network has an arbitrary weight.

7. The converter of claim 1, wherein each of the plurality of constant impedance sources is selected from a group consisting of a gate, a constant impedance digital AND gate, a complementary switch mode amplifier, a voltage mode class D (digital) amplifier, and combinations thereof.

8. The converter of claim 1, wherein the value of each constant output impedance is about 0.

9. A digital to analog converter, comprising:

a plurality of gates, each gate receiving a carrier signal and one of a plurality of input bits of a digital data, each gate providing a gate output;

a combiner network having a plurality of lossless elements corresponding to each of the plurality of gates, the combiner network receiving the plurality of gate outputs and providing a signal;

a resonating element connected to the combiner network for resonating the combiner network and providing a filtered output signal;

a load resistor connected to the resonating element; and an output node connected to the load resistor and the resonating element, the output node outputting the filtered output signal, wherein each of the plurality of lossless elements of the combiner network has a binary weight.

10. The digital to analog converter of claim 9, wherein the plurality of lossless elements define a plurality of capacitors in which the capacitance $C_i$ of each capacitor is determined by the relationship:

$C_i = C/2^{(i-1)}$ for i=1 to n where n is the number of bits and where i is a capacitor number which increases from 1 for the capacitor corresponding to a gate receiving the most significant bit (MSB) input to n for the capacitor corresponding to a gate receiving the least significant bit (LSB) input.

11. The digital to analog converter of claim 9, wherein the plurality of lossless elements define a plurality of inductors in which the inductance $L_i$ of each inductor is determined by the relationship:

$L_i = 2^{(i-1)} * L$ for i=1 to n where n is the number of bits and where i is an inductor number which increases from 1 for the inductor corresponding to a gate receiving the most significant bit (MSB) input to n for the inductor corresponding to a gate receiving the least significant bit (LSB) input.

12. A digital to analog converter comprising:

a plurality of gates, each gate receiving a carrier signal and one of a plurality of input bits of a digital data, each gate providing a gate output;

a combiner network having a plurality of lossless elements corresponding to each of the plurality of gates, the combiner network receiving the plurality of gate outputs and providing a signal;

a resonating element connected to the combiner network for resonating the combiner network and providing a filtered output signal;

a loud resistor connected to the resonating element;

an output note connected to the load resistor and the resonating element, the output node outputting the filtered output signal; and a terminating element connected with the combiner network.

13. A digital to analog converter, comprising:

a plurality of gates, each gate receiving a carrier signal and one of a plurality of input bits of a digital data, each gate providing a gate output;

a combiner network having a plurality of lossless elements corresponding to each of the plurality of gates, the combiner network receiving the plurality of gate outputs and providing a signal;

a resonating element connected to the combiner network for resonating the combiner network and providing a filtered output signal;

a loud resistor connected to the resonating element;

an output node connected to the load resistor and the resonating element, the output node outputting the filtered output signal; and wherein the plurality of lossless elements of the combiner network form a lossless elements ladder.

14. The digital to analog converter of claim 13, wherein the lossless elements ladder is a C/2C ladder.

15. The digital to analog converter of claim 13, wherein the lossless elements ladder is a 2L/L ladder.

16. The digital to analog converter of claim 12, wherein the terminating element is a capacitor or an inductor.

17. The digital to analog converter of claim 9, wherein the resonating element is a capacitor or an inductor.

18. The digital to analog converter of claim 9, wherein each of the carrier signals has a different amplitude and a different phase.

19. A method for digital to analog conversion of a bandpass signal, the method comprising:

receiving a carrier signal and one of a plurality of input bits of a digital data at a plurality of gates to provide a plurality of gate outputs;

receiving each of the plurality of output gates at a corresponding one of a plurality of lossless elements to provide a weighted gate output from each lossless element;

combining the plurality of weighted gate outputs to form a combined signal; and filtering the combined signal through a resonator to provide a digitally weighted filtered output signal, wherein each of the plurality of lossless elements of the combiner network has a binary weight.

20. The method of claim 19, wherein the plurality of lossless elements define a plurality of capacitors in which the capacitance $C_i$ of each capacitor is determined by the relationship:

$C_i = C/2^{(i-1)}$ for i=1 to n where n is the number of bits and where i is a capacitor number which increases from 1 for the capacitor corresponding to a gate receiving the most significant bit (MSB) input to n for the capacitor corresponding to a gate receiving the least significant bit (LSB) input.

21. The method of claim 19, wherein the plurality of lossless elements define a plurality of inductors in which the inductance $L_i$ of each inductor is determined by the relationship:

$L_i = 2^{(i-1)} * L$ for i=1 to n where n is the number of bits and where i is an inductor number which increases from 1 for the inductor corresponding to a gate receiving the most significant bit (MSB) input to n for the inductor corresponding to a gate receiving the least significant bit (LSB) input.

22. A method for digital to analog conversion of a bandpass signal, the method comprising:
receiving a carrier signal and one of a plurality of input bits of a digital data at a plurality of gates to provide a plurality of gate outputs;
receiving each of the plurality of output gates at a corresponding one of a plurality of lossless elements to provide a weighted gate output from each lossless element;
combining the plurality of weighted gate outputs to form a combined signal;
filtering the combined signal through a resonator to provide a digitally weighted filtered output signal, and
a terminating element connected with the combiner network.

23. The method of claim 22, wherein the terminating element is a capacitor or an inductor.

24. A method for digital to analog conversion of a bandpass signal, the method comprising:
receiving a carrier signal and one of a plurality of input bits of a digital data at a plurality of gates to provide a plurality of gate outputs;
receiving each of the plurality of output gates at a corresponding one of a plurality of lossless elements to provide a weighted gate output from each lossless element;
combining the plurality of weighted gate outputs to form a combined signal; and
filtering the combined signal through a resonator to provide a digitally weighted filtered output signal.,
wherein the plurality of lossless elements of the combiner network form a lossless elements ladder.

25. The method of claim 24, wherein the lossless elements ladder is a C/2C ladder.

26. The method of claim 24, wherein the lossless elements ladder is a 2L/L ladder.

27. The method of claim 19, wherein the resonator is a capacitor or an inductor.

28. The method of claim 19, wherein each of the carrier signals has a different amplitude and a different phase.

29. The method of claim 19, wherein each of the carrier signals has a different amplitude, a different frequency and a different phase.

30. A converter, comprising:
a plurality of first constant impedance sources and a second constant impedance source, each constant impedance source having a constant output impedance, each constant impedance source providing an output;
a combiner network having a plurality of first impedance elements corresponding to the plurality of first constant impedance sources and a plurality of second impedance elements coupled to the second constant impedance source, the combiner network receiving the plurality of outputs and providing a signal;
a resonating element connected to the combiner network for resonating the signal received from the combiner network and providing a filtered output signal;
a load impedance element connected to the resonating element; and
an output node connected between the load impedance element and the resonating element, the output node outputting the filtered output signal.

31. The converter of claim 30, wherein each constant impedance source receives a different carrier signal of arbitrary amplitude and phase and one of a plurality of input bits of a digital data.

32. The converter of claim 30, wherein each of the plurality of first impedance elements is selected from a group consisting of a capacitor, an inductor, a resistor, a transmission line, a transformer, and combinations thereof.

33. The converter of claim 30, wherein each of the plurality of second impedance elements is selected from a group consisting of a capacitor, an inductor, a resistor, a transmission line, a transformer, and combinations thereof.

34. The converter of claim 30, wherein the resonating element is selected from a group consisting of a capacitor, an inductor, a resistor, a transmission line, a transformer, and combinations thereof.

35. The converter of claim 30, wherein each of the plurality of first impedance elements of the combiner network has a binary weight.

36. The converter of claim 30, wherein each of the plurality of second impedance elements of the combiner network has a different binary weight.

37. The converter of claim 30, wherein each of the plurality of first impedance elements of the combiner network has an arbitrary weight.

38. The converter of claim 30, wherein each of the plurality of second impedance elements of the combiner network has an arbitrary weight.

39. The converter of claim 30, wherein the plurality of first impedance elements of the combiner network form an impedance elements ladder.

40. The converter of claim 30, wherein the plurality of second impedance elements of the combiner network form an impedance elements ladder.

41. The converter of claim 30, wherein each of the plurality of first constant impedance sources is selected from a group consisting of a gate, a constant impedance digital AND gate, a complementary switch mode amplifier, a voltage mode class D (digital) amplifier, and combinations thereof.

42. The converter of claim 30, wherein the second constant impedance source is selected from a group consisting of a gate, a constant impedance digital AND gate, a complementary switch mode amplifier, a voltage mode class D (digital) amplifier, and combinations thereof.

43. The converter of claim 30, wherein the value of each constant output impedance is about 0.

* * * * *

UNITED STATES PATENT AND TRADEMARK OFFICE
CERTIFICATE OF CORRECTION

PATENT NO. : 8,013,771 B2  Page 1 of 1
APPLICATION NO. : 12/688734
DATED : September 6, 2011
INVENTOR(S) : Richard W. D. Booth et al.

It is certified that error appears in the above-identified patent and that said Letters Patent is hereby corrected as shown below:

In the Claims:

Claim 24, Col. 21, line 41, "signal.," should read --signal,--.

Signed and Sealed this
Twenty-eighth Day of February, 2012

David J. Kappos
*Director of the United States Patent and Trademark Office*